(12) United States Patent
Hu et al.

(10) Patent No.: US 10,254,612 B2
(45) Date of Patent: Apr. 9, 2019

(54) DISPLAY PANEL AND METHOD OF FABRICATING THE SAME

(71) Applicants: HannStar Display (Nanjing) Corporation, Nanjing (CN); HannStar Display Corporation, Taipei (TW)

(72) Inventors: Hsien-Tang Hu, Taichung (TW); Hsuan-Chen Liu, Kaohsiung (TW); Chien-Ting Chan, Tainan (TW)

(73) Assignees: HannStar Display (Nanjing) Corporation, Nanjing (CN); HannStar Display Corporation, Taipei (TW)

( * ) Notice: Subject to any disclaimer, the term of this patent is extended or adjusted under 35 U.S.C. 154(b) by 0 days.

(21) Appl. No.: 15/623,398

(22) Filed: Jun. 15, 2017

(65) Prior Publication Data

US 2018/0188574 A1     Jul. 5, 2018

(30) Foreign Application Priority Data

Dec. 29, 2016   (CN) .......................... 2016 1 1243661

(51) Int. Cl.

| G02F 1/1335 | (2006.01) |
| G02F 1/1368 | (2006.01) |
| H01L 27/12 | (2006.01) |
| H01L 29/786 | (2006.01) |
| G02F 1/133 | (2006.01) |
| G02F 1/1362 | (2006.01) |
| G02F 1/1343 | (2006.01) |

(Continued)

(52) U.S. Cl.
CPC .......... *G02F 1/1368* (2013.01); *G02F 1/1339* (2013.01); *G02F 1/13306* (2013.01); *G02F 1/134309* (2013.01); *G02F 1/136286* (2013.01); *H01L 27/124* (2013.01); *H01L 27/1262* (2013.01); *H01L 29/7869* (2013.01); *H01L 29/78669* (2013.01); *H01L 29/78678* (2013.01); *G02F 2001/13629* (2013.01); *G02F 2001/136295* (2013.01); *G02F 2201/121* (2013.01); *G02F 2201/123* (2013.01); *G02F 2202/10* (2013.01); *G11C 19/28* (2013.01)

(58) Field of Classification Search
CPC ........ H01J 9/20; H01J 9/02; H01J 2893/0022; G02F 1/13306; G02F 1/1339
See application file for complete search history.

(56) References Cited

U.S. PATENT DOCUMENTS

| 2004/0051836 A1* | 3/2004 | Jung ..................... G02F 1/1345 349/149 |
| 2005/0270451 A1* | 12/2005 | Ahn .................. G02F 1/133555 349/114 |
| 2006/0027804 A1* | 2/2006 | Yamazaki ............. G02F 1/1368 257/59 |

* cited by examiner

*Primary Examiner* — Selim U Ahmed
*Assistant Examiner* — Andre C Stevenson
(74) *Attorney, Agent, or Firm* — CKC & Partners Co., LLC

(57) ABSTRACT

A display panel is provided, and includes a first substrate, a connecting structure, a passivation layer, a second substrate and a sealant. The first substrate has an active area and a peripheral area. The connecting structure is disposed on the first substrate and located in the peripheral area, and is configured to electrically connect different metal layers. The passivation layer is disposed on and covers the connecting structure. The second substrate is disposed opposite to the first substrate. The sealant is sandwiched between the first substrate and the second substrate. In the display panel, a vertical projection of the sealant on the first substrate and a vertical projection of the connecting structure on the first substrate are overlapped.

9 Claims, 21 Drawing Sheets

(51) Int. Cl.
*G02F 1/1339* (2006.01)
*G11C 19/28* (2006.01)

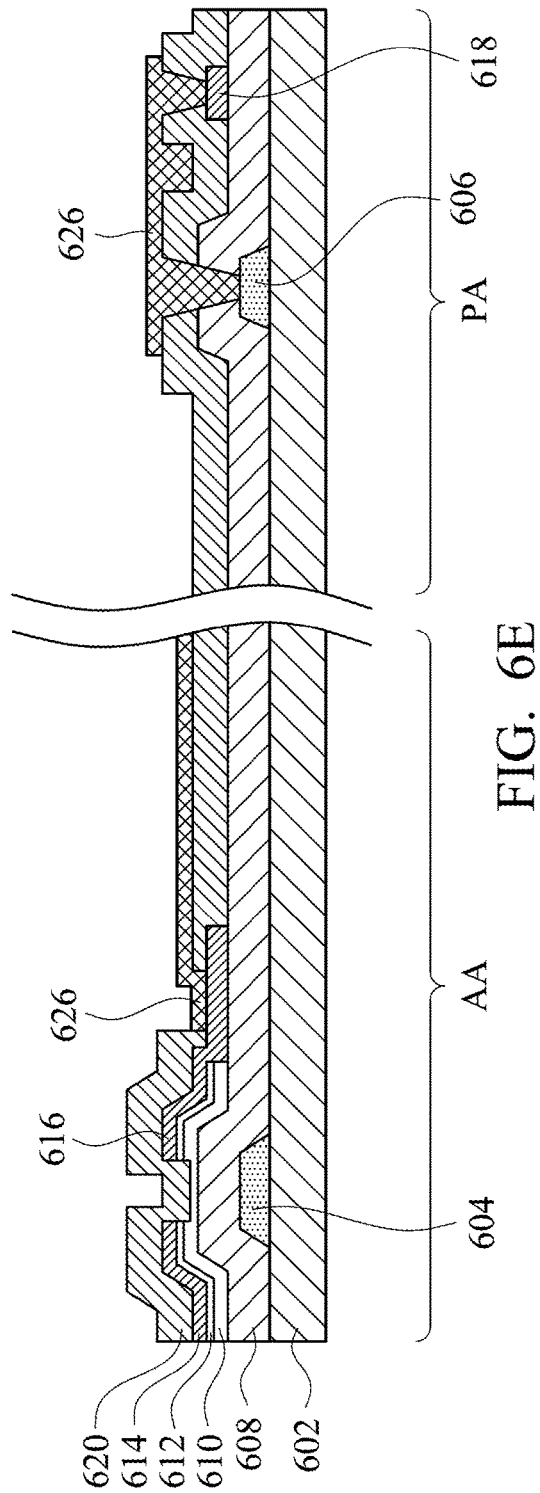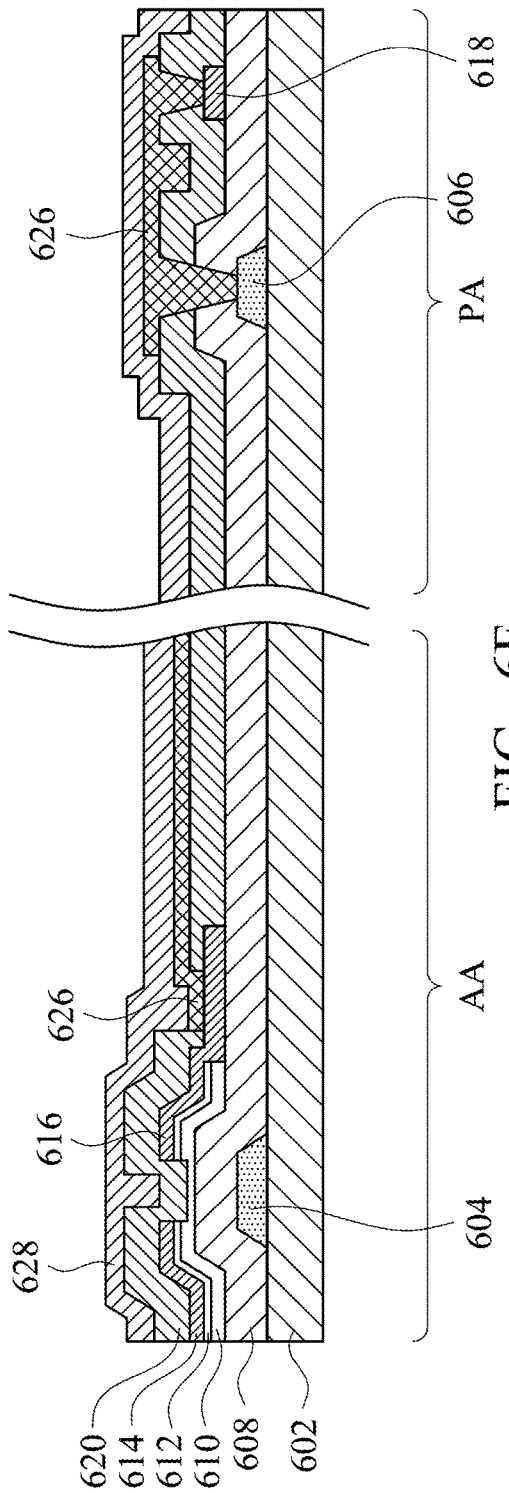

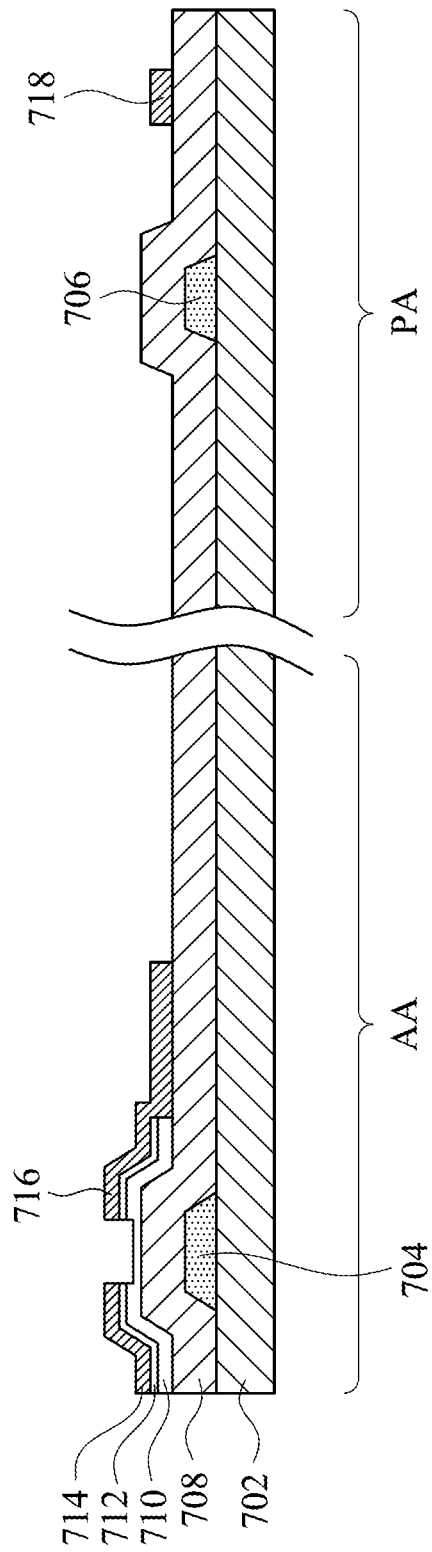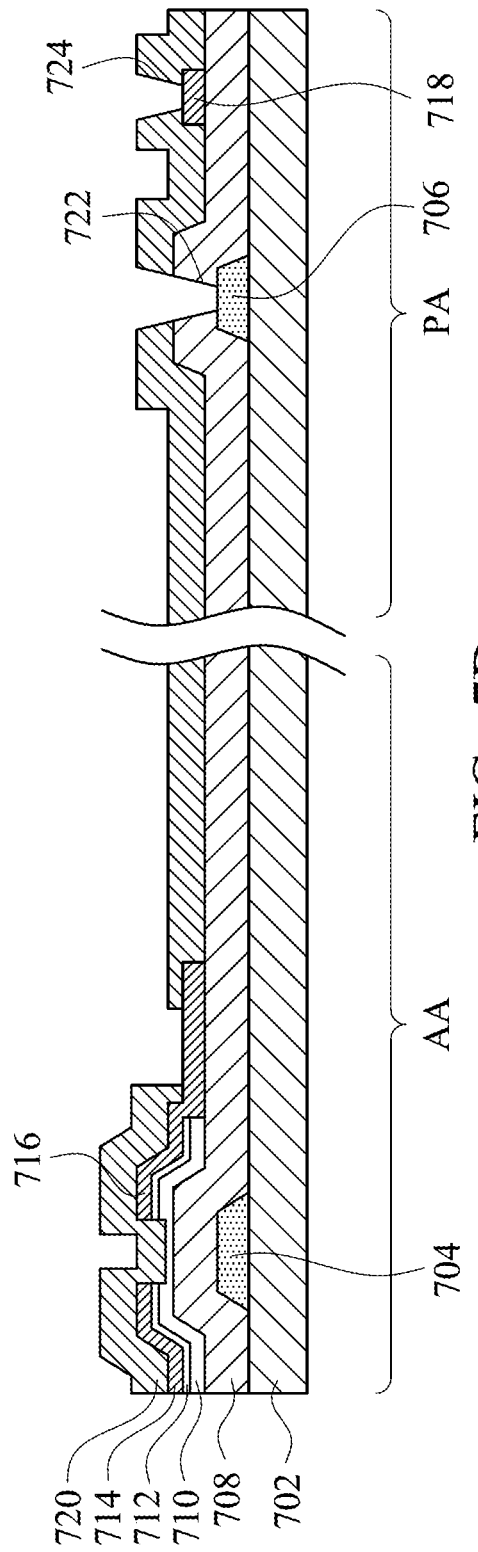

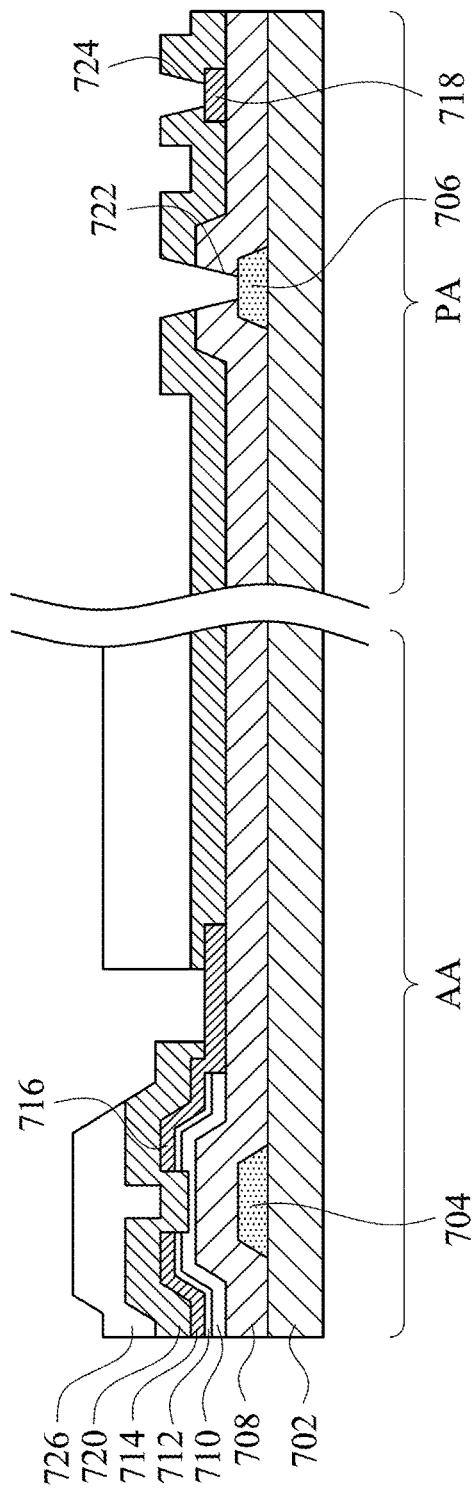
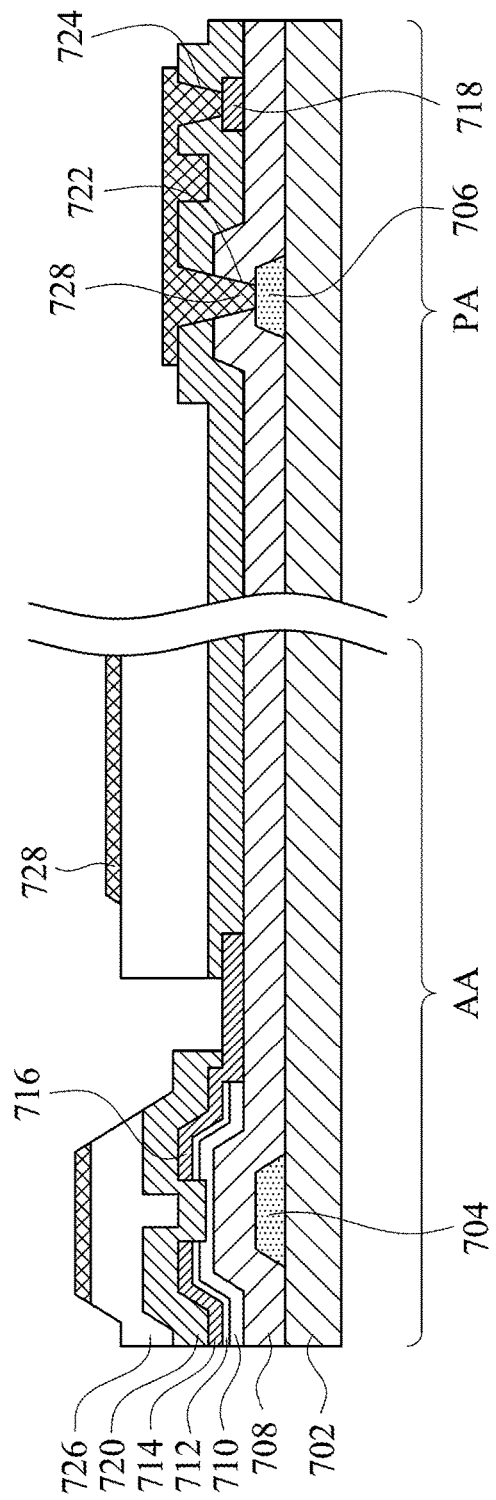

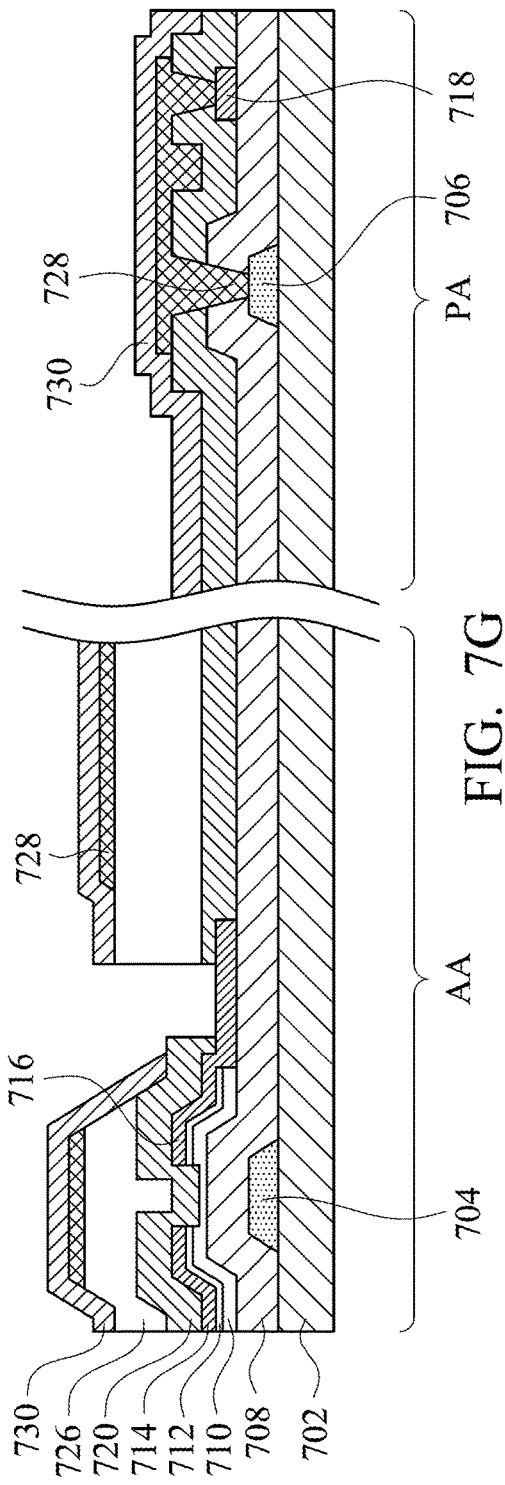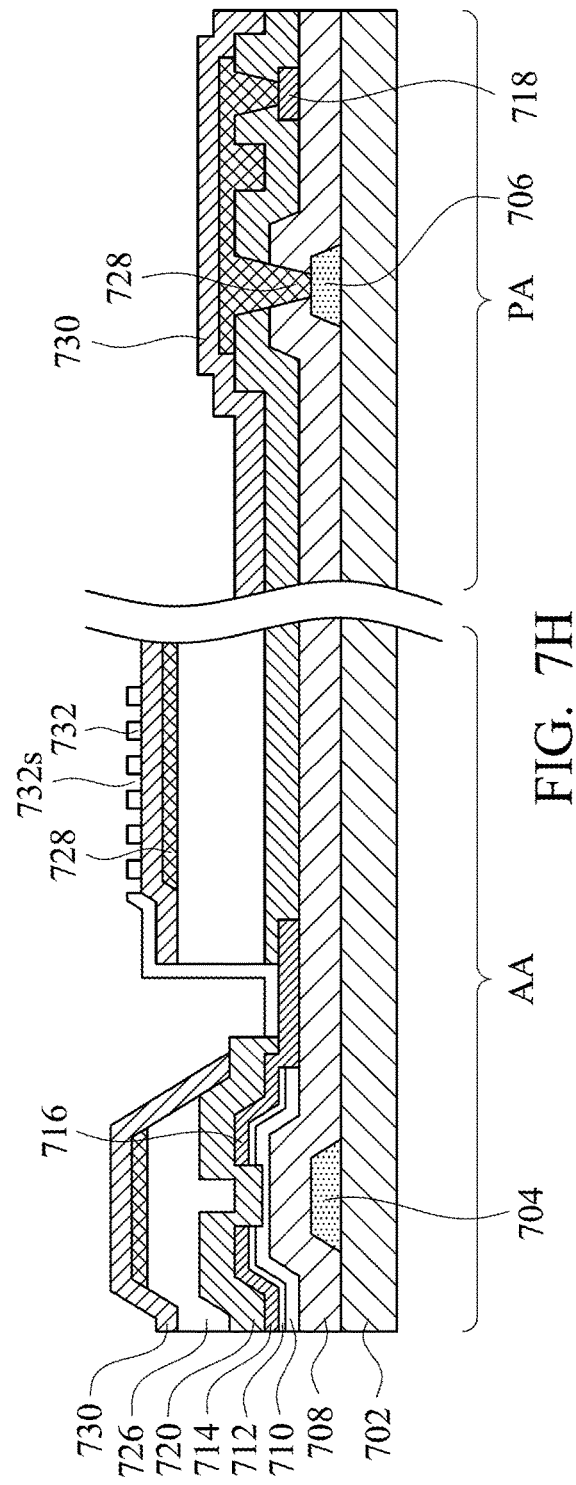

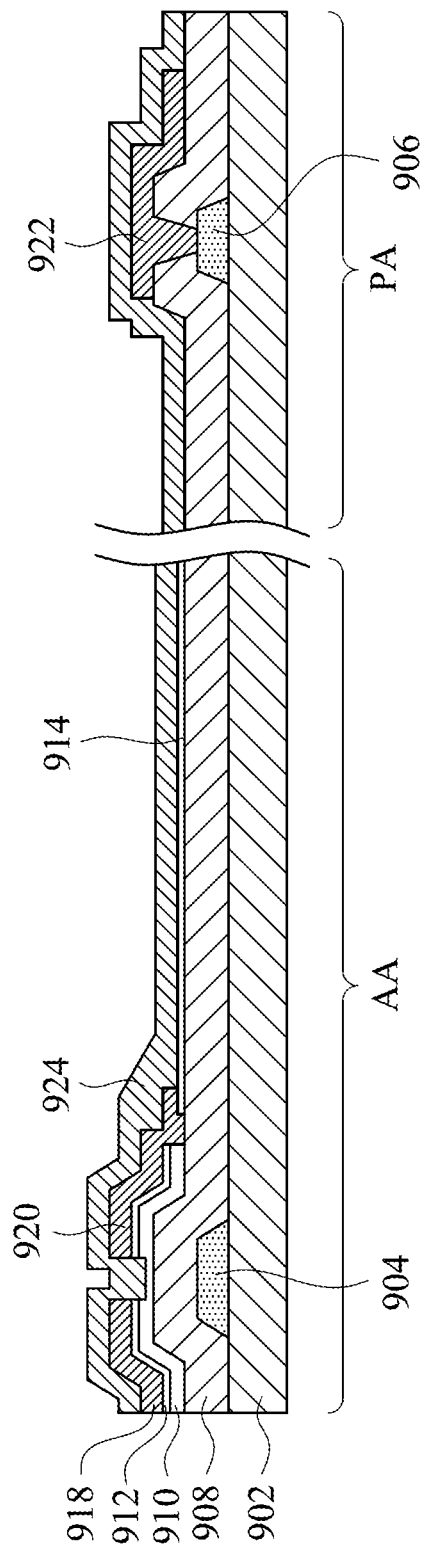
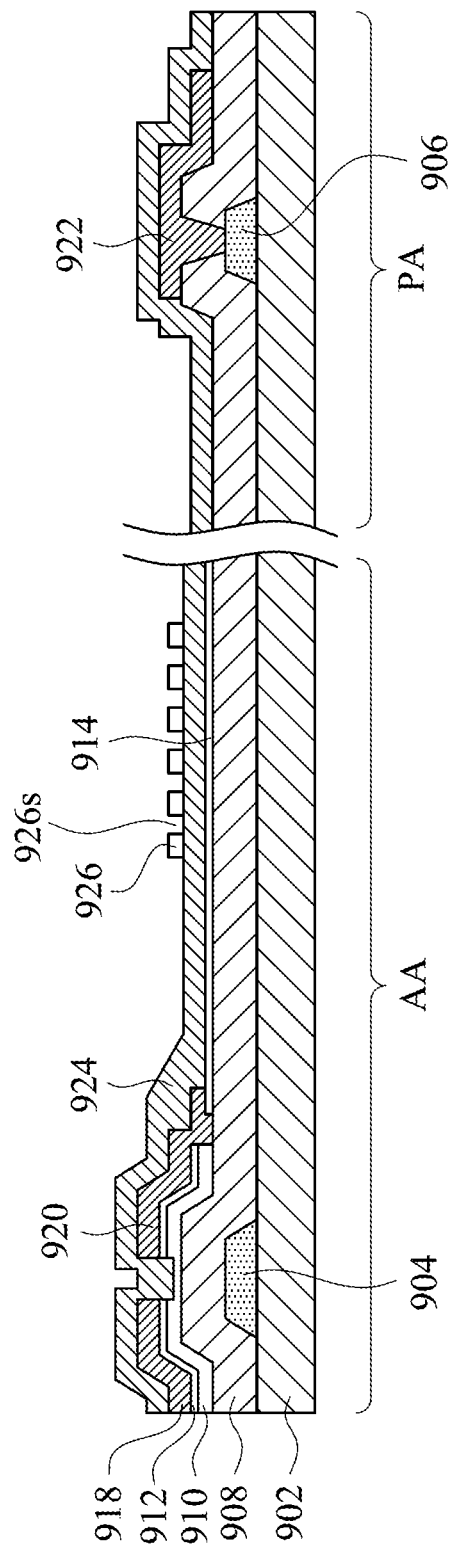

DISPLAY PANEL AND METHOD OF FABRICATING THE SAME

RELATED APPLICATIONS

This application claims priority to Chinese Patent Application Serial Number 201611243661.2, filed on Dec. 29, 2016, which is herein incorporated by reference,

BACKGROUND

Field of the Invention

The invention relates to a display panel and a method of fabricating the display panel, and more particularly to a display panel with an integrated driving circuit and a method of fabricating the display panel with the integrated driving circuit, Description of Related Art With the advance of development of thin film transistor (TFT) liquid crystal display, technologies of integrating a driving circuit (e.g. a gate driving circuit) on a display panel, such as a system on glass (SOG) technology, have been widely applied to conventional display devices, thereby minimizing and improving the size and performance of the display devices. However, the elements of the driving circuit integrated in the display panel are likely to be eroded by external moisture, thus resulting in a reliability issue and reduction of operation life of the display device.

SUMMARY

An object of the invention is to provide a display panel and a method of forming the display panel for effectively blocking external moisture from eroding elements of a driving circuit integrated in the display panel, avoiding causing an abnormal operation and reducing an operation life of the driving circuit.

One aspect of the invention is directed to a display panel which includes a first substrate, a connecting structure, a passivation layer, a second substrate and a sealant. The first substrate has an active area and a peripheral area. The connecting structure is disposed on the first substrate and located in the peripheral area, and is configured to electrically connect different metal layers. The passivation layer is disposed on and covers the connecting structure. The second substrate is disposed opposite to the first substrate. The sealant is sandwiched between the first substrate and the second substrate. In the display panel, a vertical projection of the sealant on the first substrate and a vertical projection of the connecting structure on the first substrate are overlapped.

In one or more embodiments of the invention, the connecting structure includes a first metal layer, an insulating layer and a second metal layer. The first metal layer is disposed on the first substrate. The insulating layer is disposed on the first substrate and the first metal layer and includes a through hole exposing the first metal layer. The second metal layer is disposed on the insulating layer and is electrically connected to the first metal layer through the through hole.

In one or more embodiments of the invention, the connecting structure includes a first metal layer, a first insulating layer, a second metal layer, a second insulating layer and a conductive layer. The first metal layer is disposed on the first substrate. The first insulating layer is disposed on the first substrate and the first metal layer. The second metal layer is disposed on the first insulating layer. The second insulating layer is disposed on the first insulating layer and the second metal layer. A combination of the first insulating layer and the second insulating layer includes a first through hole, the second insulating layer further includes a second through hole, and the first through hole and the second through hole expose the first metal layer and the second metal layer, respectively. The conductive layer is disposed on the second insulating layer and is electrically connected to the first metal layer and the second metal layer respectively through the first through hole and second through hole.

In one or more embodiments of the invention, the conductive layer is a transparent conductive layer.

In one or more embodiments of the invention, the display panel further includes a pixel unit. The pixel unit is located on the active area of the first substrate and includes a thin film transistor (TFT), a pixel electrode and a common electrode. The conductive layer and one of the pixel electrode and the common electrode belong to the same layer.

In one or more embodiments of the invention, the display panel further includes a pixel unit. The pixel unit is located on the active area of the first substrate and includes a TFT covered by the passivation layer.

In one or more embodiments of the invention, the passivation layer is disposed extending from the active area to the peripheral area.

In one or more embodiments of the invention, the display panel further includes a driving circuit. The driving circuit is disposed on the first substrate and located in the peripheral area, and includes the connecting structure.

In one or more embodiments of the invention, the driving circuit includes a TFT which includes a gate, a source and a drain. The gate and one of the first metal layer and the second metal layer belong to the same layer. The source, the drain and the other of the first metal layer and the second metal layer belong to the same layer. One of the source and the drain is electrically connected to the gate through the connecting structure.

In one or more embodiments of the invention, the driving circuit includes a first TFT and a second TFT. The first TFT includes a first gate, a first source and a first drain, and the second TFT includes a second gate, a second source and a second drain. The first gate, the second gate and one of the first metal layer and the second metal layer belong to the same layer, and the first source, the first drain, the second source, the second drain and the other of the first metal layer and the second metal layer belong to the same layer. One of the first source and the first drain is electrically connected to the second gate through the connecting structure.

In one or more embodiments of the invention, the driving circuit includes a TFT and a signal line. The signal line is electrically connected to the TFT through a connecting line. The signal line and one of the first metal layer and the second metal layer belong to the same layer, and the connecting line and the other of the first metal layer and the second metal layer belong to the same layer. The signal line is electrically connected to the connecting line through the connecting structure.

Another aspect of the invention is directed to method of manufacturing a display panel which includes: providing a first substrate which has an active area and a peripheral area; forming a TFT and a connecting structure on the first substrate and respectively located in the active area and the peripheral area; and forming a passivation layer on and covering the connecting structure and the TFT. The connecting structure is configured to electrically connect different metal layers.

In one or more embodiments of the invention, the step of forming the connecting structure includes: forming a first metal layer on the first substrate; forming an insulating layer on the first substrate and the first metal layer; forming a through hole in the insulating layer; and forming a second metal layer on the insulating layer. The through hole penetrates the insulating layer to expose the first metal layer, and second metal layer is electrically connected to the first metal layer through the through hole.

In one or more embodiments of the invention, the step of forming the connecting structure includes: forming a first metal layer on the first substrate; forming a first insulating layer on the first substrate and the first metal layer; forming a second metal layer on the first insulating layer; forming a second insulating layer on the first insulating layer and the second metal layer; forming a first through hole which penetrates the first insulating layer and the second insulating layer and exposes the first metal layer; forming a second through hole which penetrates the second insulating layer and exposes the second metal layer; and forming a conductive layer which is on the second insulating layer and is electrically connected to the first metal layer and the second metal layer respectively through the first through hole and second through hole.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

FIG. 6A to FIG. 6G are schematic cross-sectional views of intermediate stages of fabricating a display panel in accordance with some embodiments of the invention.

FIG. 7A to FIG. 7H are schematic cross-sectional views of intermediate stages of fabricating a display panel in accordance with some embodiments of the invention.

FIG. 9A to FIG. 9F are schematic cross-sectional views of intermediate stages of fabricating a display panel in accordance with some embodiments of the invention.

DETAILED DESCRIPTION

The detailed explanation of the invention is described as following. The described preferred embodiments are presented for purposes of illustrations and description, and they are not intended to limit the scope of the invention.

It will be understood that, although the terms "first," "second," and "third" may be used herein to describe various elements, components, areas, layers and/or portions, these elements, components, areas, layers and/or portions, should not be limited by these terms. These terms are only used to distinguish elements, components, areas, layers and/or portions.

Figure 1A:
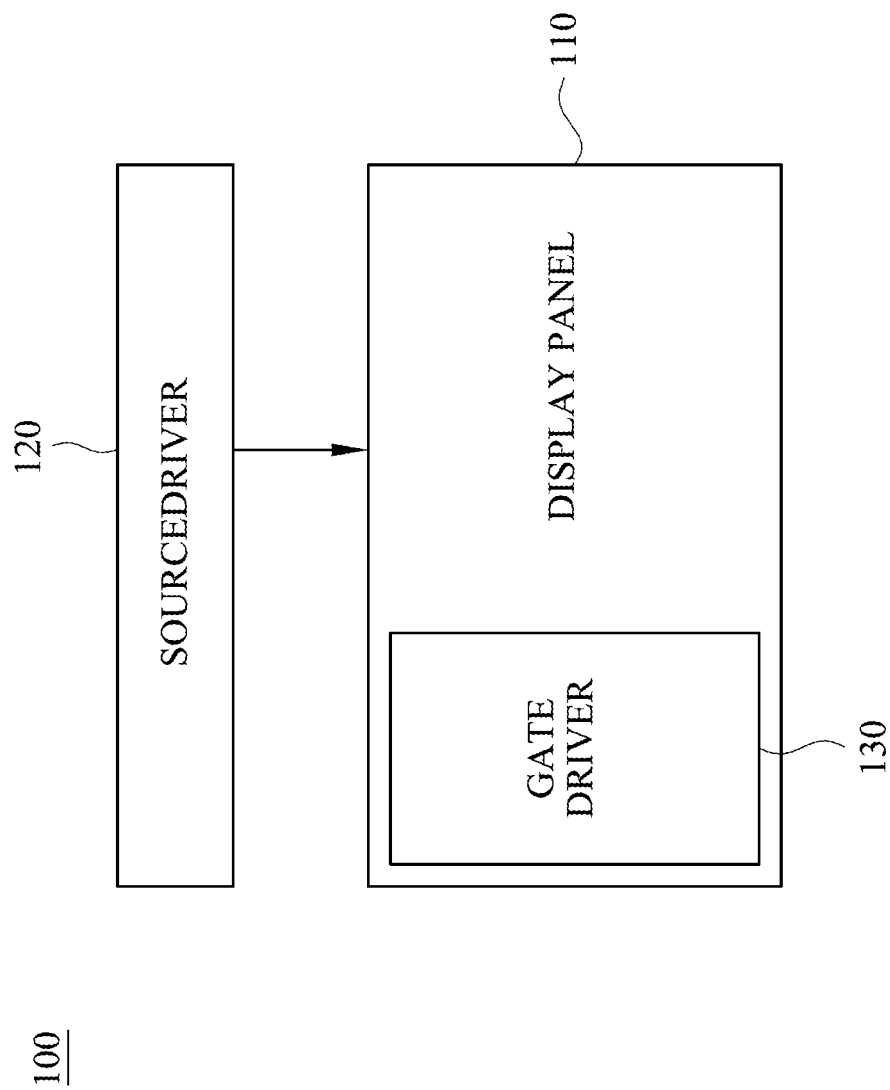
FIG. 1A is a schematic diagram of a display device in accordance with some embodiments of the invention.

Referring to FIG. 1A, FIG. 1A is a schematic diagram of a display device 100 in accordance with some embodiments of the invention. The display device 100 includes a display panel 110, a source driver 120 and a gate driver 130. The display panel 110 includes pixels arranged in a matrix for collectively displaying an image. The display panel 110 may be, for example, a liquid crystal display (LCD) apparatus of twisted nematic (TN) mode, in-plane switching (IPS) mode, fringe-field switching (FFS) mode, vertical alignment (VA) mode or other different modes. The source driver 120 is electrically connected to the display panel 110, and is configured to convert image data into source driving signals and transmit the source driving signals to the display panel 110. The gate driver 130 is configured to generate and transmit gate driving signals to the display panel 110. The display panel 110 displays an image by the driving of the source driving signals and the gate driving signals.

The display device 100 of the invention is a system on glass (SOG) panel. That is, in the invention, the electrical components of the gate driver 130 and the display panel 110 may be made simultaneously by the same process(es). For illustration, thin film transistors (TFTs) of gate driving circuits in the gate driver 130 and TFTs in an active area of the display panel 110 may be made simultaneously by the same process(es). In other embodiments, the electrical components of the display panel 110, the source driver 120 and the gate driver 130 may be made simultaneously by the same process(es).

Figure 1B:
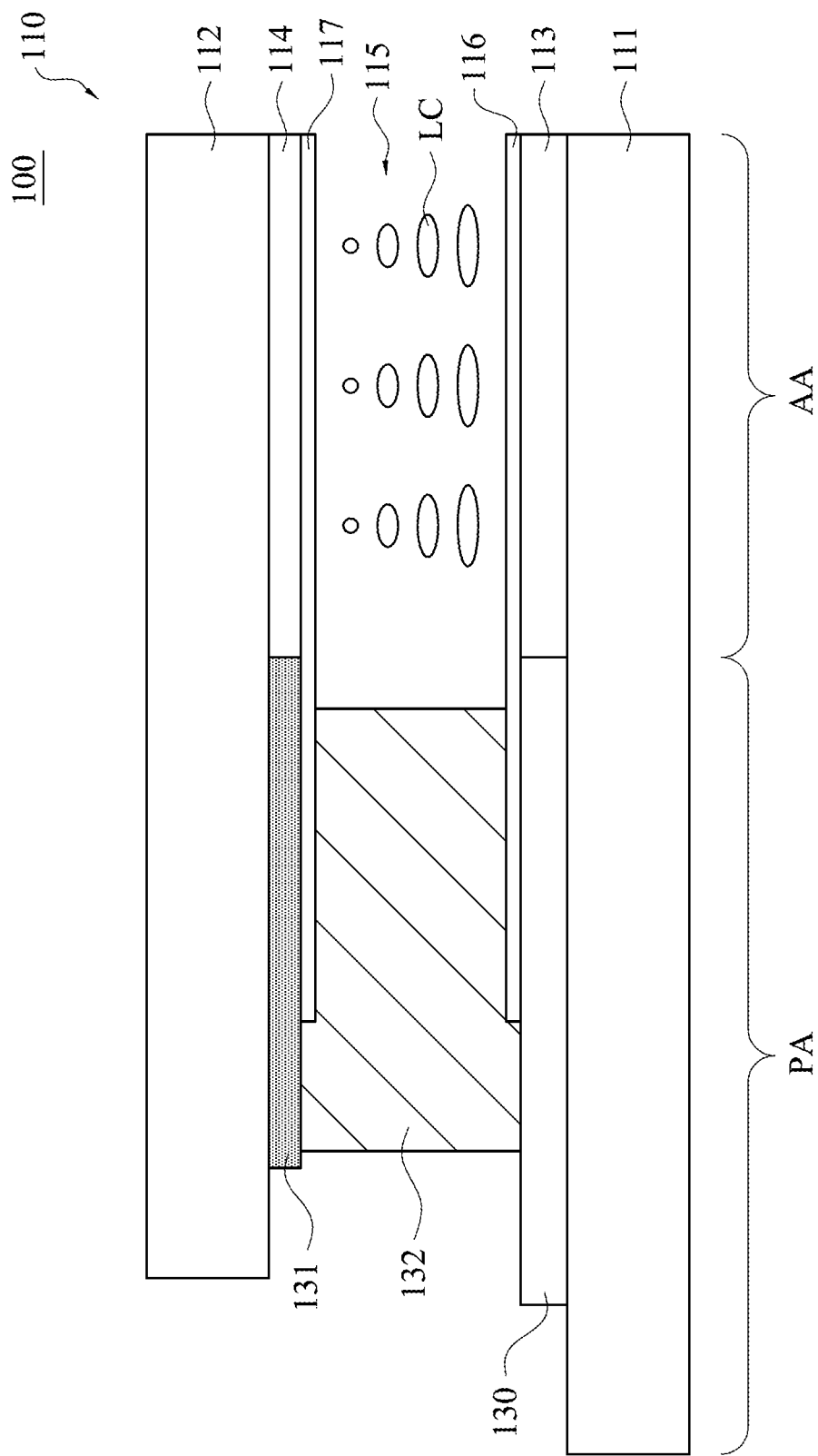
FIG. 1B is a partial cross-sectional view of the display panel of FIG. 1A.

FIG. 1B is a partial cross-sectional view of the display panel 110 of FIG. 1A. As shown in FIG. 1B, the display panel 110 includes a first substrate 111 (or called a TFT substrate) and a second substrate 112 (or called a color filter substrate) and includes an active area AA and a peripheral area PA.

In the active area AA of the display panel 110, an active component layer 113 (including components of TFTs, gate lines, data lines and pixel electrodes) and a color filter layer 114 are disposed on the first substrate 111 and the second substrate 112, respectively, and a liquid crystal layer 115 is disposed between the active component layer 113 and the color filter layer 114. The liquid crystal layer 115 includes liquid crystal molecules LC which are correspondingly twisted or rotated by the electric field of the display panel 110. The TFTs of the active component layer 113 may be amorphous silicon TFTs, low temperature polysilicon (LTPS) TFTs, indium gallium zinc oxide (IGZO) TFTs or other suitable TFTs. Alignment layers 116 and 117 are disposed between the active component layer 113 and the liquid crystal layer 115 and between the color filter layer 114 and the liquid crystal layer 115, respectively, and are used to control the alignment direction of the liquid crystal molecules LC. The display panel 110 further includes a common electrode layer (not shown) which is configured to interact with the pixel electrodes of the active component layer 113 to generate an electric field, such that the liquid crystal molecules LC of the liquid crystal layer 116 are correspondingly twisted or rotated by the electric field. The common electrode layer may be disposed at different locations based on the type of the display panel. For illustration, if the display panel 110 is a TN type LCD panel or a VA type LCD panel, the common electrode layer and the pixel electrodes are respectively disposed at two opposite sides of the liquid crystal layer 115; if the display panel 110 is an IPS display panel or an FFS display panel, the common electrode layer and the pixel electrodes are at the same side of the liquid crystal layer 115.

In the peripheral area PA of the display panel 110, the gate driver 130 is disposed on the first substrate 111, a shielding layer 131 is disposed on the second substrate 112, and a sealant 132 is disposed between the gate driver 130 and the shielding layer 131. The sealant 132 is a closed frame structure, and the active area AA is in the closed area surrounded by the sealant 132 in the direction perpendicular to the first substrate 111. In addition to bonding the first substrate 111 and the second substrate 112, the disposal of the sealant 132 can prevent external moisture from entering the active area AA and then eroding the components in the active area AA (e.g. common electrodes and pixel electrodes). The sealant 132 may be photo-curable sealant which is cured through illumination by light. Because the shielding layer 131 is disposed on the second substrate 112, light illuminates from the lower side of the first substrate 111 (i.e. the side of the first substrate 111 away from the liquid crystal layer 115), and then passes through the first substrate 111 to cure the sealant 132. In addition, the sealant 132 may completely cover or partially cover the gate driver 130 in a direction perpendicular to the first substrate 111.

Figure 2A:
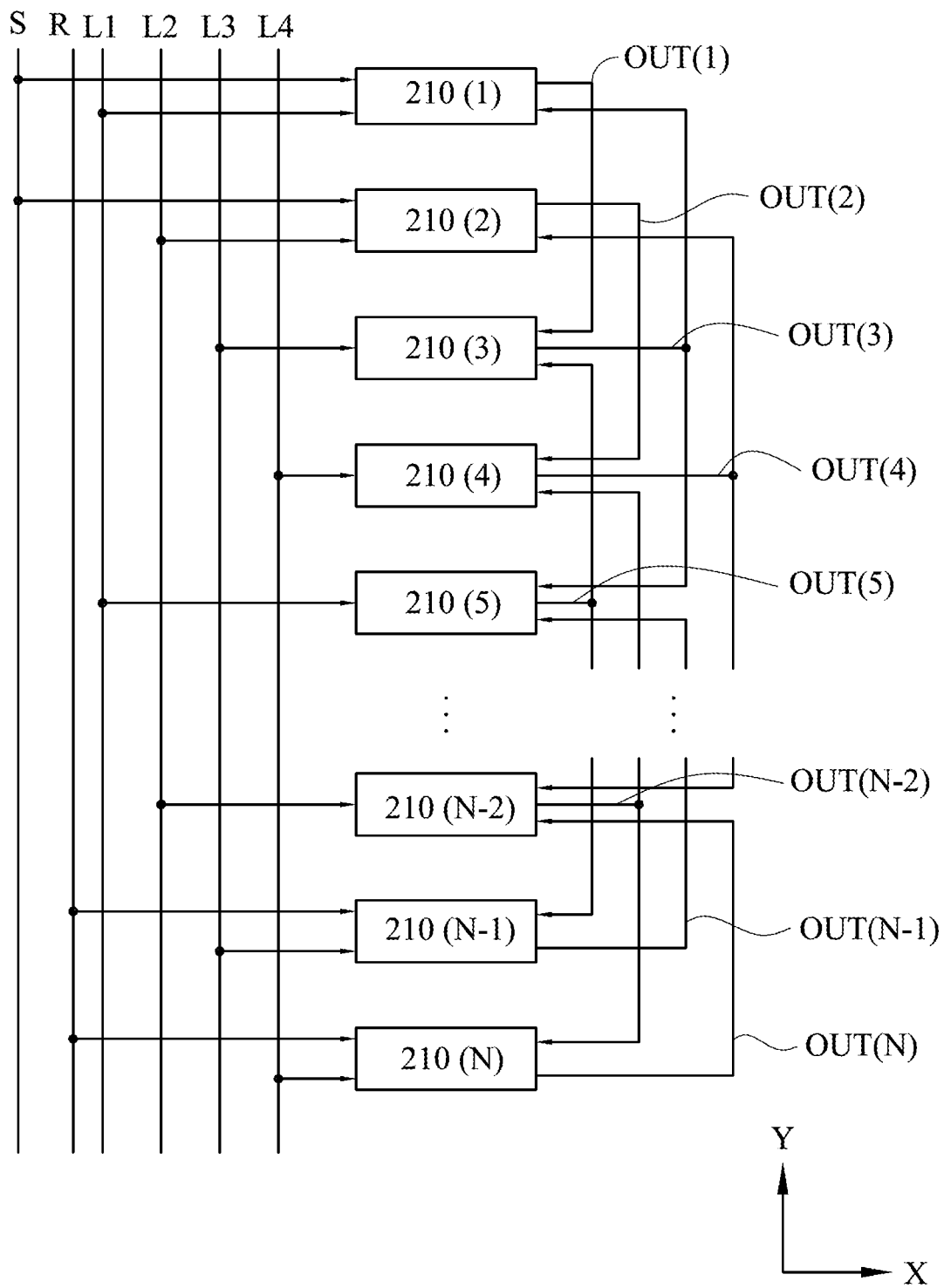
FIG. 2A is a schematic diagram of a gate driving circuit in accordance with some embodiments of the invention.
Figure 2B:
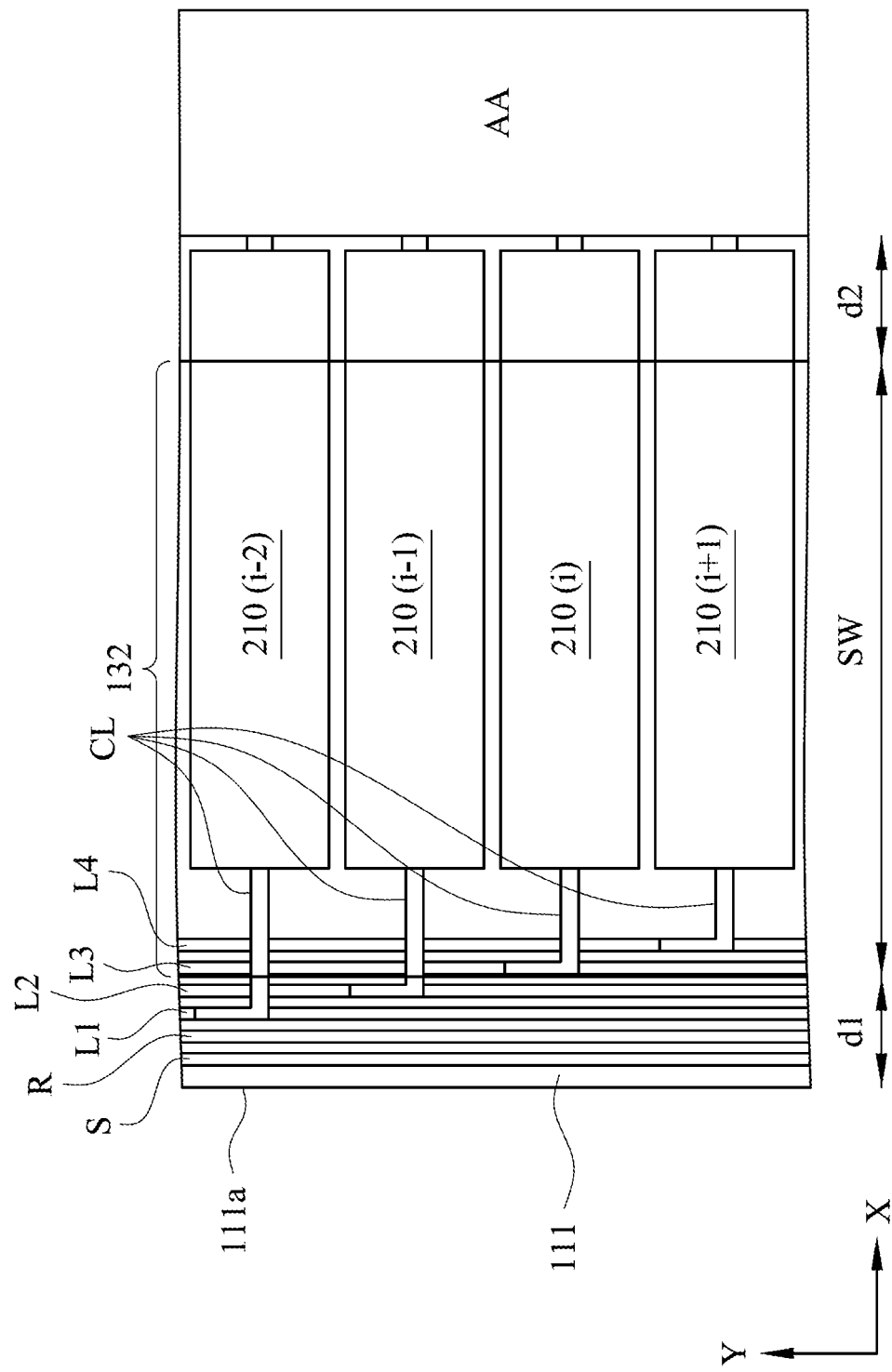
FIG. 2B is a layout block diagram of the gate driving circuit of FIG. 2A.

Referring to FIG. 2A and FIG. 2B, FIG. 2A is a schematic diagram of a gate driving circuit 200 in accordance with some embodiments of the invention, and FIG. 2B is a layout block diagram of the gate driving circuit 200. The gate driving circuit 200 may be used for the display device 100 of FIG. 1A or another similar display device. In the following, the gate driving circuit 200 applied to the display device 100 of FIG. 1A is exemplified for description. The gate driving circuit 200 is at least a portion of the gate driver 130 of FIG. 1A and FIG. 1B, and includes signal lines and N-stage shift register circuits 210(1)-210(N), where N is an integer greater than and equal to 5. In some embodiments, N is a multiple of 4.

In the embodiments of FIG. 2A, the signal lines include clock signal lines L1-L4, a starting signal line S and an ending signal line R. However, in the invention, the number and the type of signal lines are not limited. In other embodiments, the signal lines may further include a forward input signal line, a backward input signal line and a pull-down control signal line.

As shown in FIG. 2B, the vertical projections of the sealant 132 , some of the signal lines (including the clock signal lines L3 and L4) and some of the shift register circuits 210(1)-210(N) on the first substrate 111 are overlapped. In other embodiments, the sealant 132 may cover a portion of the signal lines or a portion of the shift register circuits 210(1)-210(N) in the direction perpendicular to the first substrate 111. In some other embodiments, the sealant 132 may cover all of the signal lines (including the clock signal lines L1-L4, the starting signal line S and the ending signal line R) and/or completely cover all of the shift register circuits 210(1)-210(N) in the direction perpendicular to the first substrate 111. In other words, in the invention, the sealant 132 may cover at least a portion of the signal lines and the shift register circuits 210(1)-210(N) in the direction perpendicular to the first substrate 111. That is, the sealant 132 may completely or partially cover the gate driver 130 in the direction perpendicular to the first substrate 111. The distance between the sealant 132 and a side 111a of the first substrate 111 is d1, and distance between the sealant 132 and the active area AA is d2, so as to prevent the sealant 132 from spilling out of the display panel 110 or covering the active area AA due to an process deviation in the coating process to the sealant 132. For example, the distance d1 may be greater than or equal to 100 microns and less than or equal to 150 microns, the distance d2 may be greater than or equal to 350 microns and less than or equal to 400 microns, but is not limited thereto. Those ordinary skill in the art may self-adjust the distances d1 and d2 depending on display panel designs and process capabilities. In addition, a width SW of the sealant 132 affects the ability of preventing moisture from entering into the display panel. If the width SW becomes larger, the ability of preventing moisture is better. Because different materials for the sealant 132 have different moisture blocking abilities, the width SW of the sealant 132 may be corresponding adjusted depending on the material of the sealant 132. In some embodiments, the width SW of the sealant 132 is disposed between 400 microns and 600 microns, and preferably about 500 microns.

The clock signal lines L1-L4 are configured to provide clock signals C1-C4 to the corresponding shift register circuits 210(1)-210(N). In FIG. 2A, the clock signal lines L1-L4 respectively provide the clock signals C1-C4 to the corresponding shift register circuits 210(1)-210(N). In addition, the starting signal line S provides a starting signal STV to the $1^{st}$ stage and the $2^{nd}$ stage shift register circuits 210(1) and 210(2), and the ending signal line R provides an ending signal RST to the $(N-1)^{th}$ stage and the $n^{th}$ stage shift register circuits 210(N-1) and 210(N). The shift register circuits 210(1)-210(N) generate scan signals OUT(1)-OUT(N), respectively. Among the shift register circuit 210(1)-210(N), the scan signals OUT(1) and OUT(2) are inputted to the $3^{rd}$ stage and the $4^{th}$ stage shift register circuits 210(3) and 210(4), respectively, the scan signals OUT(N-1) and OUT(N) are inputted to the $(N-3)^{th}$ stage and the $(N-2)^{th}$ stage shift register circuits 210(N-3) and 210(N-2), respectively, and each of the other scan signals OUT(3)-OUT(N-2) is inputted to the shift registers second previous thereto and second next thereto. For illustration, the scan signal OUT(3) is inputted to the $1^{st}$ stage and the $5^{th}$ stage shift register circuits 210(1) and 210(5).

As shown in FIG. 2A and FIG. 2B, the clock signal lines L1-L4, the starting signal line S and the ending signal line R extend in the Y direction, and are respectively electrically connected to the shift register circuit 210(1)-210(N) through the connecting lines CL which extend in the X direction. Each of the connecting lines CL is electrically connected to one of the clock signal lines L1-L4, and therefore the connecting lines CL and the signal lines L1-L4 are formed by different metal layers, in order to prevent a short circuit phenomenon due to intersections of the connecting lines CL and the clock signal lines L1-L4. In addition, each of the connecting lines CL is electrically connected to one of the clock signal lines L1-L4 via the connecting structure, and such connecting structure is used to electrically connect different metal layers. For illustration, the clock signal lines L1-L4 are formed in a first metal layer, and the connecting lines CL are formed in a second metal layer, and an insulating layer (not shown) is disposed between the first metal layer and the second metal layer. The connecting lines CL is electrically connected to one of the signal lines via the connecting structure which is used for connecting the first metal layer and the second metal layer. It is noted that the invention is not limited to the abovementioned descriptions. For illustration, in some embodiments, the connecting lines CL are formed in the first metal layer, and the signal lines are formed in the second metal layer.

Figure 3:
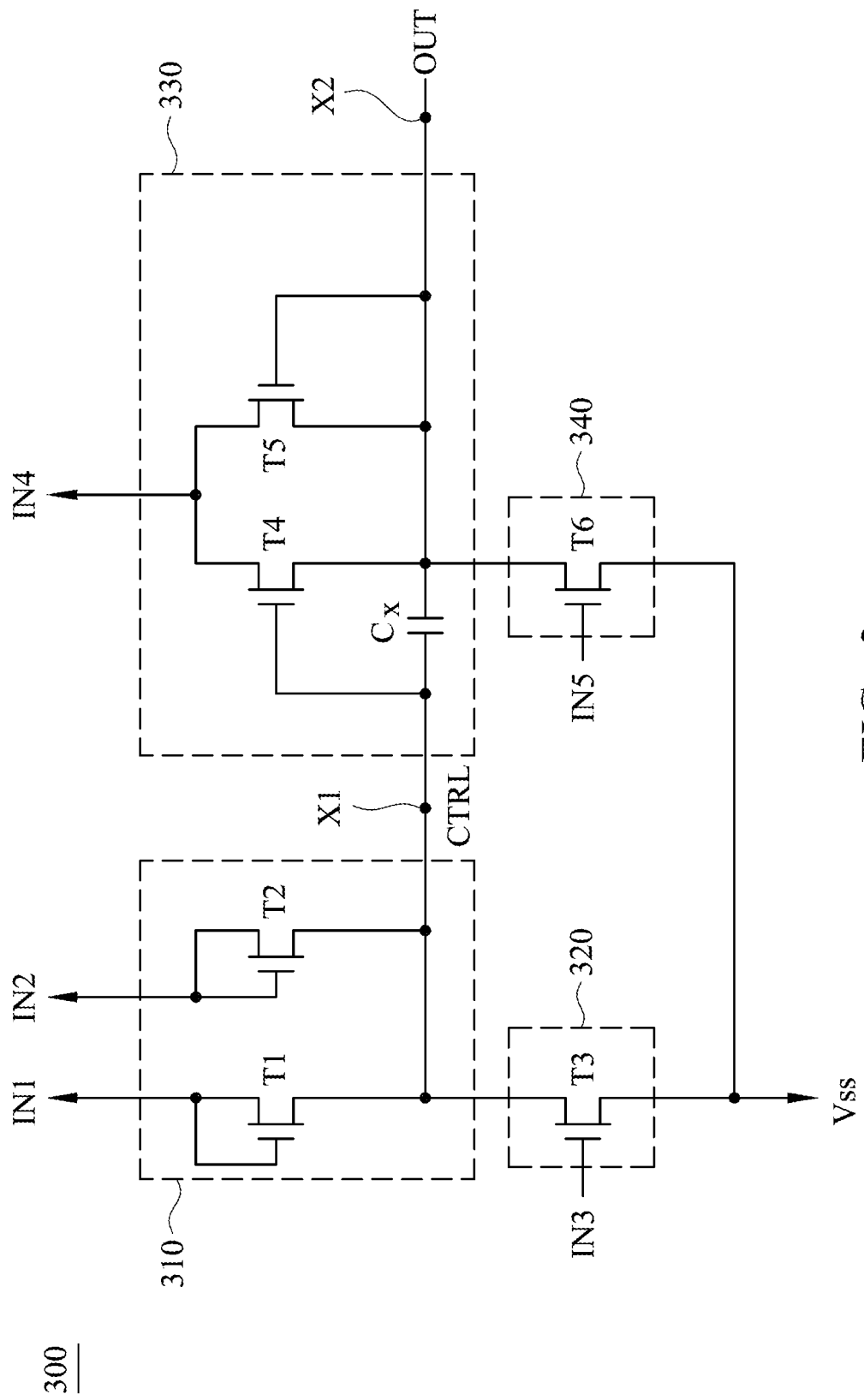
FIG. 3 is an equivalent circuit diagram of a shift register circuit in accordance with some embodiments of the invention.

FIG. 3 is an equivalent circuit diagram of a shift register circuit 300 in accordance with some embodiments of the invention. The shift register circuit 300 may be any of the 1$^{st}$ stage to N$^{th}$ stage shift register circuits 210(1)-210(N) of FIG. 2A or any of other type shift register circuits.

As shown in FIG. 3, the shift register circuit 300 includes a precharge unit 310, a first pull-down unit 320, an output unit 330 and a second pull-down unit 340. The precharge unit 310 is configured to receive the input signal IN1-IN2 and to output a control signal CTRL via a node X1. The first pull-down unit 320 is coupled to the precharge unit 310, and is configured to receive the input signal IN3 and pull-down the voltage level of the node X1. The output unit 330 is coupled to the precharge unit 310, and is configured to receive the control signal CTRL and the input signal IN4 and to output a scan signal OUT via a node X2. The second pull-down unit 340 is coupled to the first pull-down unit 320 and the output unit 330, and is configured to receive the input signal IN5 and to reset the scan signal OUT.

The precharge unit 310 includes TFTs T1 and T2. The first terminal and second terminal of the TFT T1 are configured to receive the input signal IN1, and the third terminal of the TFT T1 is coupled to the node X1. The first terminal and second terminal of the TFT T2 are configured to receive an input signal IN2, and the third terminal of the TFT T2 is coupled to the node X1. In this embodiment, for each TFT, the first terminal, the second terminal and the third terminal are a gate, one of a source and a drain and the other of the source and the drain, respectively.

The first pull-down unit 320 includes a TFT T3. The first terminal and the second terminal of the TFT T3 are configured to receive the input signal IN3 and a reference voltage Vss, respectively, and the third terminal of the TFT T3 is coupled to the node X1.

The output unit 330 includes a capacitor Cx and TFTs T4 and T5. The first terminal and the second terminal of the capacitor Cx are coupled to the nodes X1 and X2, respectively. The first terminal of the TFT T4 is coupled to the node X1, the second terminal of the TFT T4 is configured to receive the input signal IN4, and the third terminal of the TFT T4 is coupled to the node X2. The first terminal and third terminal of the TFT T5 are coupled to the node X2, and the second terminal of the TFT T5 is configured to receive the input signal IN4.

The second pull-down unit 340 includes a TFT T6. The first terminal and the second terminal of the TFT T6 are configured to receive the input signal IN5 and the reference voltage Vss, respectively, and the third terminal of the TFT T6 is coupled to the node X2.

For the shift register circuit 300, the TFTs T1-T6 may be amorphous silicon TFTs, low temperature polysilicon (LTPS) TFTs, indium gallium zinc oxide (IGZO) TFTs, or other suitable TFTs.

As shown in FIG. 3, for some TFTs (e.g. TFTs T1 and T2), the gate is electrically connected to one of the drain and the source, and for some other TFTs of the shift register circuit 300 (e.g. TFTs T3 and T6), the drain or the source is electrically connected to the gate of another TFT of the shift register circuit 300 (e.g. TFT T4 or T5). The gate and the source/drain of the TFT are respectively formed by different metal layers, and therefore a connecting structure is also needed for electrically connecting the gate and the source (or the drain) therethrough.

Figure 4:
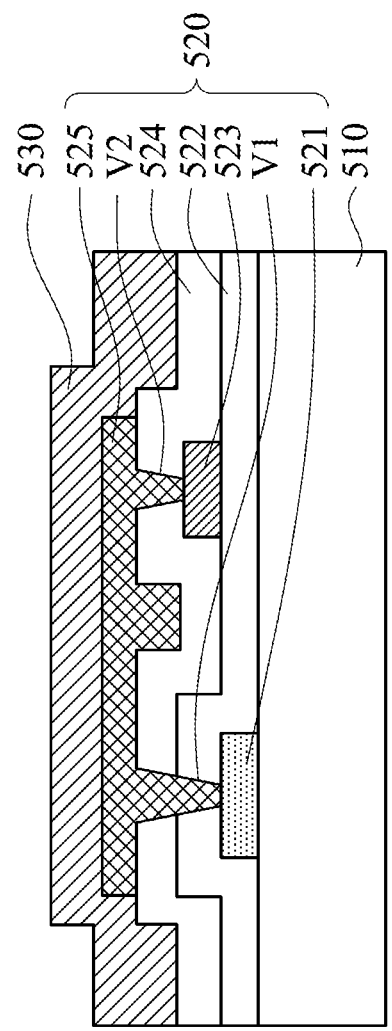
FIG. 4 is a schematic cross-sectional diagram of a connecting structure in accordance with some embodiments of the invention.

Referring to FIG. 4, FIG. 4 is a cross-sectional diagram of a connecting structure 520 in accordance with some embodiments of the invention. The connecting structure 520 may also be used to couple different metal layers of the gate driving circuit 200, and may be, for example, a connecting point of the clock signal lines L1-L4 and the connecting line CL shown in FIG. 2B or a connecting point of a first terminal of any TFT and a second terminal/third terminal of the same or different TFT shown in FIG. 3, but is not limited thereto.

As shown in FIG. 4, the connecting structure 520 is formed on the substrate 510 and includes a first metal layer 521, a first insulating layer 522, a second metal layer 523, a second insulating layer 524 and a conductive layer 525. A passivation layer 530 covers the connecting structure 520, in order to prevent from the uppermost conductive layer of the connecting structure 520 (the conductive layer 525 in the embodiment) from being eroded by external moisture and then resulting in a deterioration of the reliability of the display panel 110. The first metal layer 521 is disposed on the substrate 510, the first insulating layer 522 is disposed on the substrate 510 and the first metal layer 521, and the second metal layer 523 is disposed on the first insulating layer 522. The second insulating layer 524 is disposed on the first insulating layer 522 and the second metal layer 523. The combination of the second insulating layer 524 and the first insulating layer 522 has a through hole V1 on the first metal layer 521, and the second insulating layer 524 has a through hole V2 on the second metal layer 523. The conductive layer 525 is disposed on the first insulating layer 522, the second metal layer 523 and the second insulating layer 524 and is electrically connected to the first metal layer 521 and the second metal layer 523 respectively through the through holes V1 and V2; that is, the conductive layer 525 bridges the first metal layer 521 and the second metal layer 523. The passivation layer 530 is disposed on and covers the second insulating layer 524 and the conductive layer 525.

The substrate 510 corresponds to the first substrate 111 of FIG. 1B, the first metal layer 521 and the first terminal of the TFTs T1-T6 of the shift register circuit 300 of FIG. 3 may be formed by the same process(es), and the second metal layer 523 and the second terminal/third terminal of the TFTs T1-T6 of the shift register circuit 300 of FIG. 3 may be formed by the same process(es). The conductive layer 525 may be a transparent conductive layer, and the conductive layer 525 and the pixel electrodes of the common electrode may be formed by the same process(es). In addition, the clock signal lines L1-L4, the starting signal line S and/or the ending signal line R of the gate driving circuit 200 and one of the first metal layer 521 and the second metal layer 523 may belong to the same layer, and the connecting lines CL and the other of the first metal layer 521 and the second metal layer 523 may belong to the same layer. Further, the conductive layer 525 is completely covered by the passivation layer 530 and does not expose, and therefore external moisture can be blocked from eroding the first metal layer 521, the second metal layer 523 and the conductive layer 525. Furthermore, the sealant for bonding opposite two substrates of the display panel (e.g. the sealant 132 of FIG. 1B) may partially or completely cover the connecting structure 520, i.e., the vertical projections of the sealant and the connecting structure 520 on the substrate 510 may be overlapped. As such, the first metal layer 521 and the second metal layer 523 can be further prevented from being eroded by external moisture, and an over-resistance due a melting phenomenon of the conductive layer 525 can be avoided.

Referring to FIG. 5A to FIG. 5E, FIG. 5A to FIG. 5E are layout diagrams and cross-sectional diagrams of a portion of the gate driving circuit 200 in accordance with some embodiments of the invention. In FIG. 5A to FIG. 5E, Subfigures (i), (ii) and (iii) illustrate layout diagrams corresponding to the signal lines of FIG. 2A, the layout diagrams corresponding to the TFTs T1, T3 and T4 of the shift register circuit 300 of FIG. 3 and cross-sectional diagrams corresponding to the section line A-A' of Subfigure (ii), respectively.

Figure 5A:
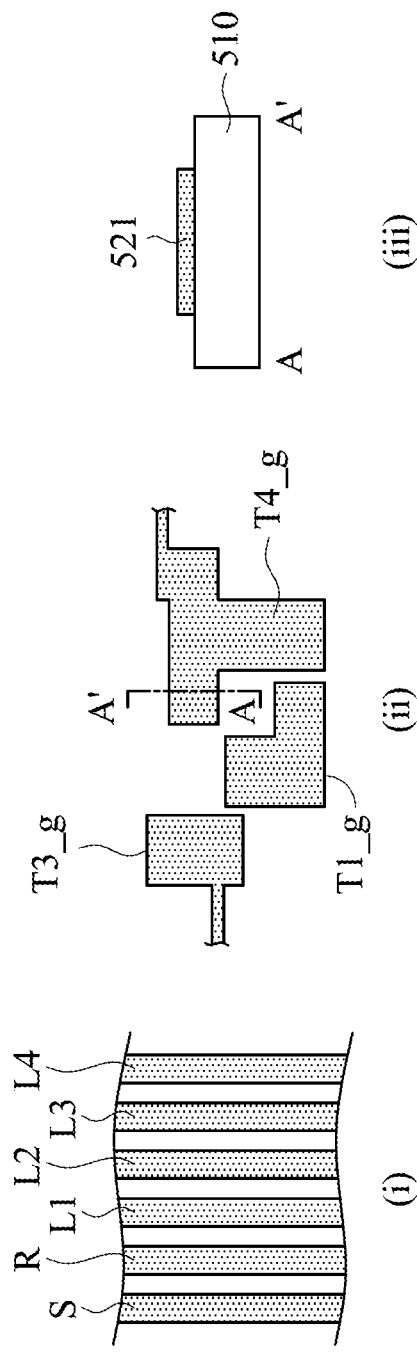
FIG. 5A to FIG. 5E are layout diagrams and cross-sectional diagrams of a portion of the gate driving circuit of FIG. 2 in accordance with some embodiments of the invention.
Figure 5B:
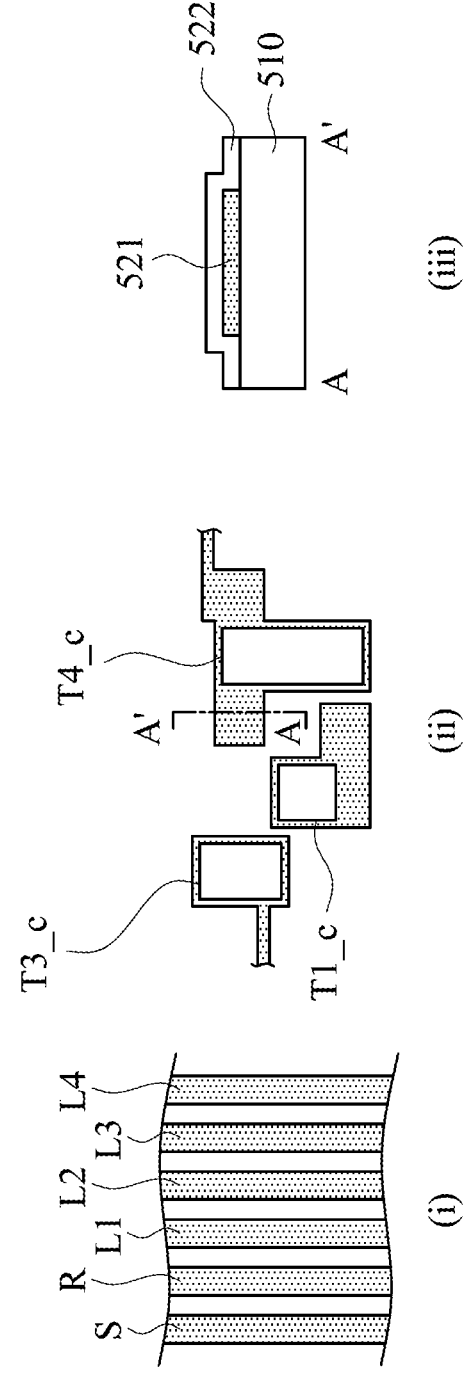

As shown in FIG. 5A, the first metal layer 521 is formed on the substrate 510, including gates T1_g, T3_g and T4_g of the TFTs T1, T3 and T4 and the clock signal lines L1-L4, the starting signal line S, the ending signal line R. Then, as shown in FIG. 5B, the first insulating layer 522 is formed, and semiconductor layers T1_c, T3_c and T4_c are formed on the first insulating layer 522 and are overlapped with the gates T1_g, T3_g and T4_g, respectively.

Figure 5C:
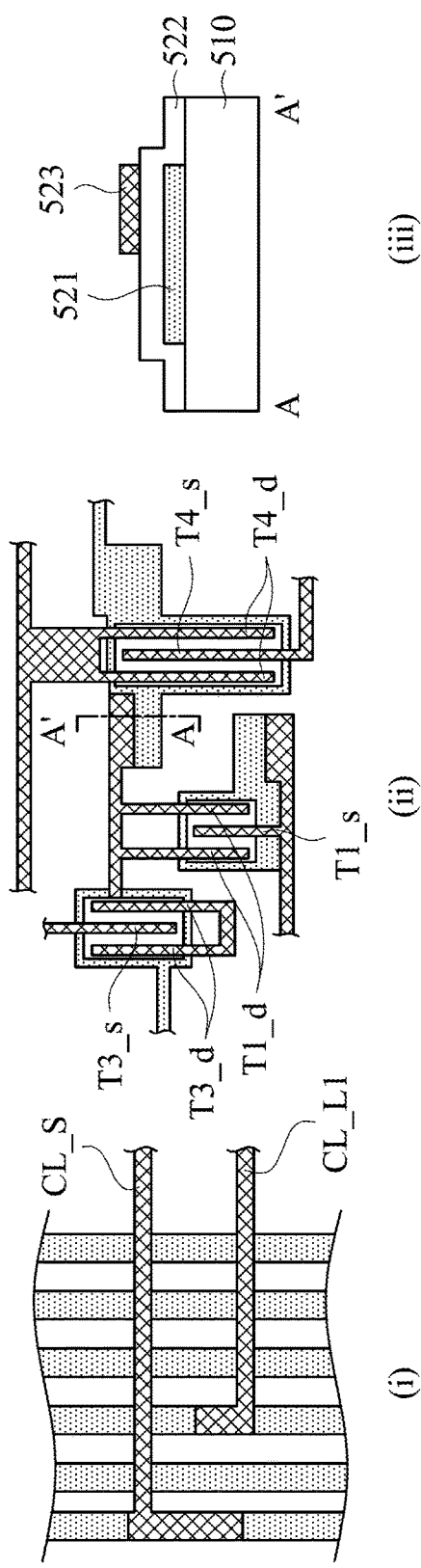
Figure 5D:
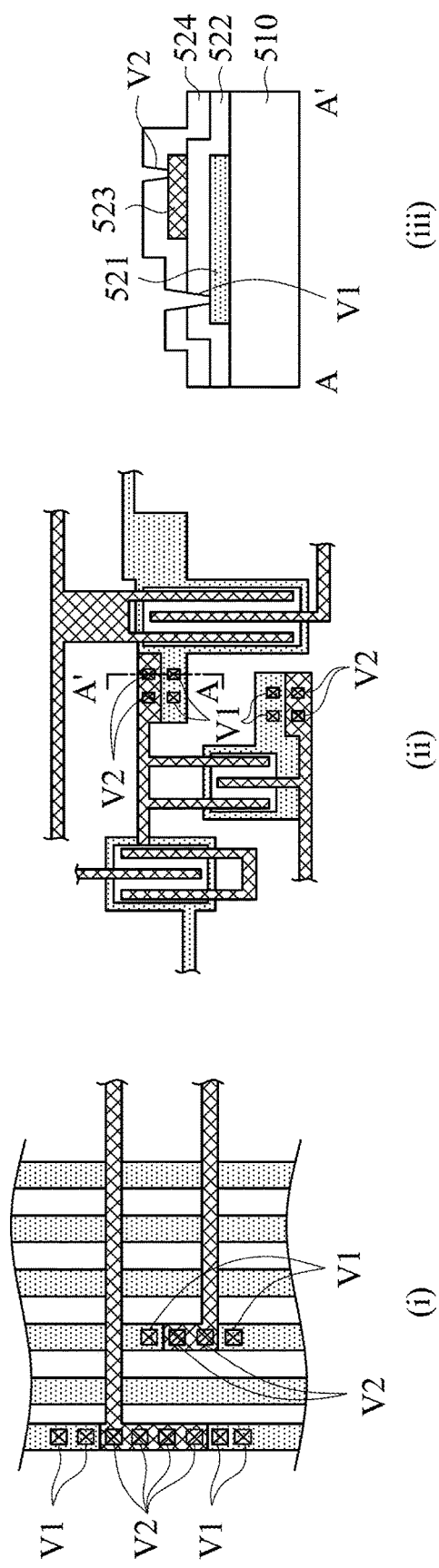

Then, as shown in FIG. 5C, the second metal layer 523 is formed including second terminals T1_s, T3_s and T4_s and third terminals T1_d, T3_d and T4_d of the TFTs T1, T3 and T4 and the connecting lines CL_S and CL_L1 which are electrically connected to the starting signal line S and the clock signal line L1. Then, as shown in FIG. 5D, the second insulating layer 524 is formed, and then an etching process is performed on the first insulating layer 522 and the second insulating layer 524, so as to form the through holes V1 and V2 respectively on the first metal layer 521 and the second metal layer 523. The through hole V1 penetrates the first insulating layer 522 and the second insulating layer 524 to expose the first metal layer 521 and the through hole V2 penetrates the second insulating layer 524 to expose the second metal layer 523.

Figure 5E:
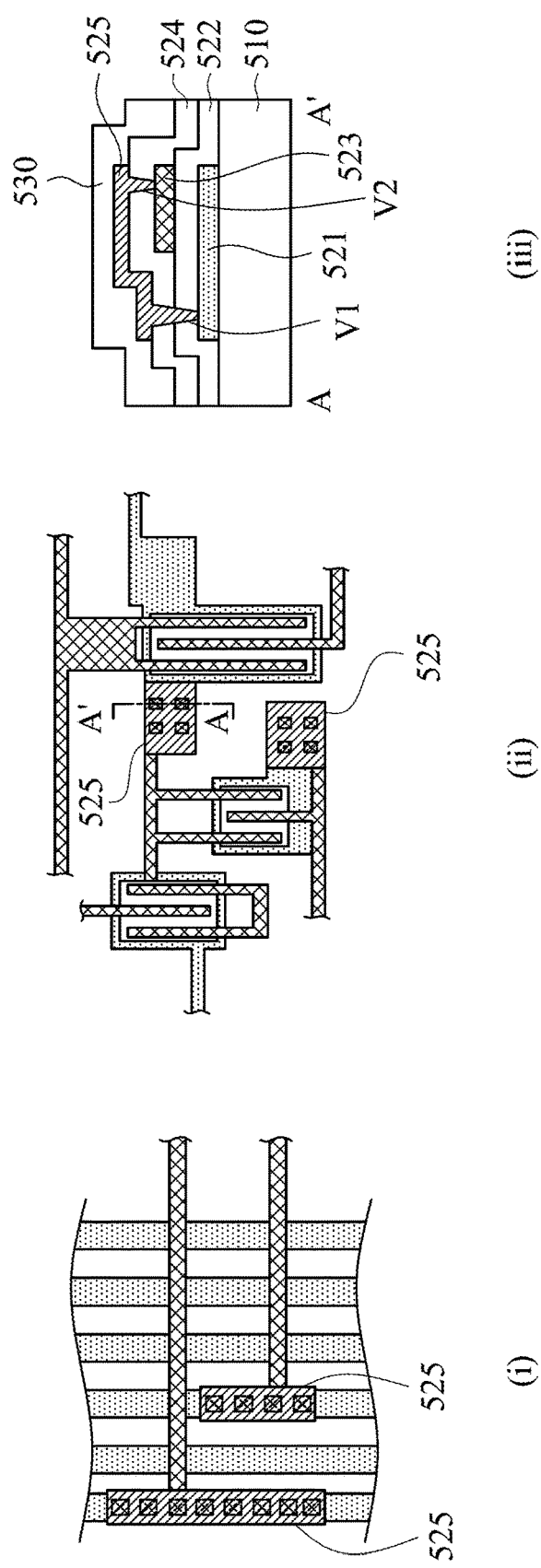

Then, as shown in FIG. 5E, the conductive layer 525 is electrically connected to the first metal layer 521 through the through hole V1 and is electrically connected to the second metal layer 523 through the through hole V2. As such, the first metal layer 521 and the second metal layer 523 are electrically connected to each other through the conductive layer 525, and therefore form the connecting structure 520 for electrically connecting different metal layers. Then, the passivation layer 530 is formed covering the connecting structure 520, in order to provide protection and insulation for the connecting structure 520.

In the following, a transverse electric field (or called horizontal electric field) type display panel is exemplified for illustrating how to fabricate the connecting structure 520 of the peripheral area PA simultaneously during the processes of forming the pixel unit of the active area AA.

Figure 6A:
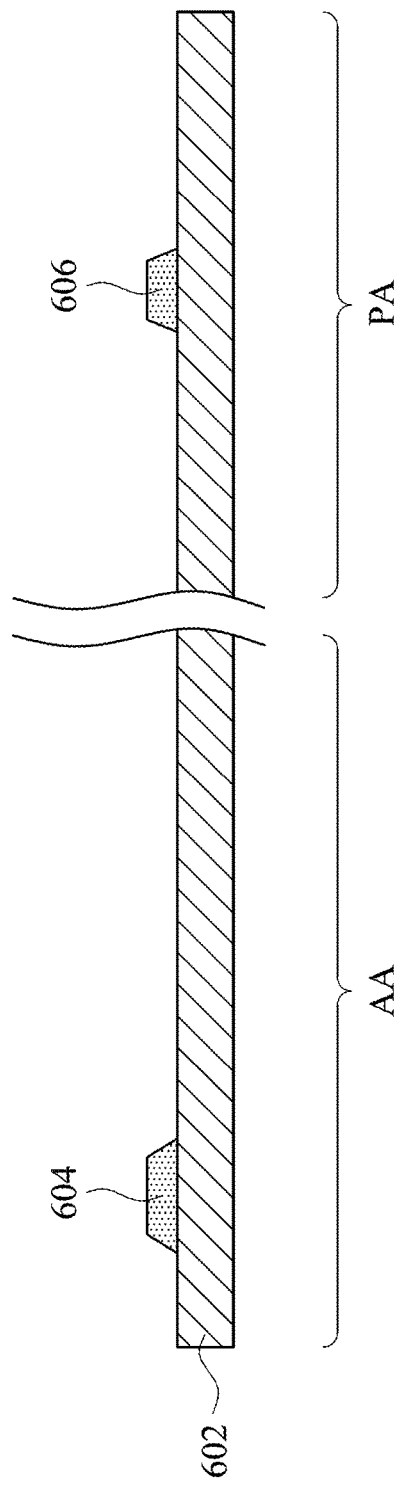

Referring to FIG. 6A to FIG. 6G, FIG. 6A to FIG. 6G are schematic cross-sectional views of intermediate stages of fabricating a display panel in accordance with some embodiments of the invention. As shown in FIG. 6A, a substrate 602 is provided, and includes an active area AA and a peripheral area PA, A gate electrode 604 and a first metal layer 606 are formed on the substrate 602 and respectively in the active area AA and in the peripheral area PA. For illustration, the first metal layer 606 includes the clock signal lines L1-L4, the starting signal line S and the ending signal line R of FIG. 2A and FIG. 2B and the gates of the TFTs of the shift register circuit 300 of FIG. 3, but the invention is not limited thereto.

Figure 6B:
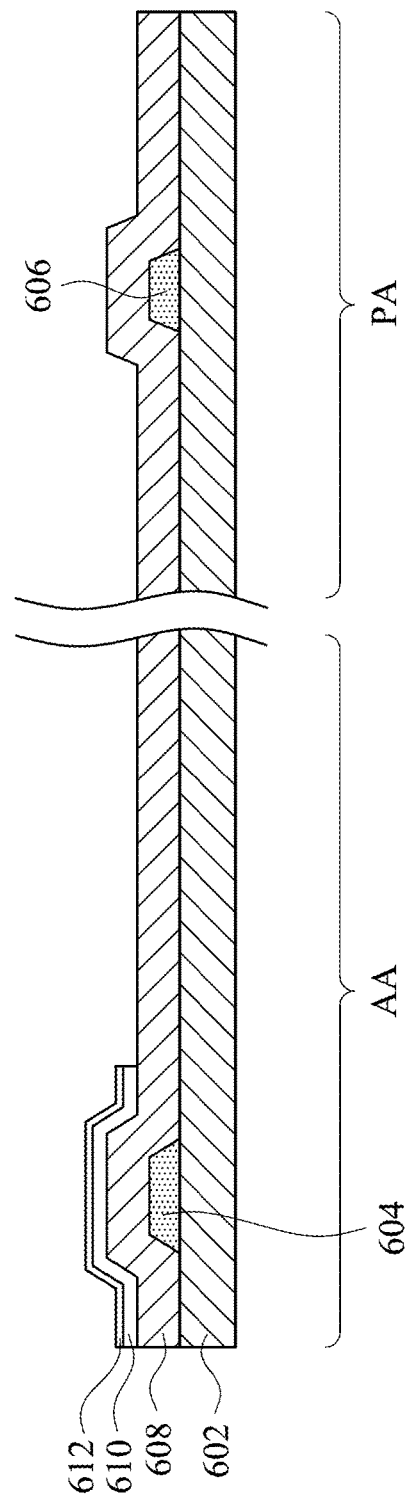

Then, as shown in FIG. 6B, an insulating layer 608 is formed on the substrate 602, the gate electrode 604 and the first metal layer 606, and a semiconductor layer 610 and a doped semiconductor layer 612 are formed on the gate electrode 604 and the insulating layer 608. The insulating layer 608 extends from the active area AA to the peripheral area PA and covers the gate electrode 604 and the first metal layer 606. The material of the semiconductor layer 610 may be amorphous silicon, monocrystalline silicon, polycrystalline silicon or another similar material, and the material of the doped semiconductor layer 612 may be correspondingly doped amorphous silicon, doped monocrystalline silicon, doped polycrystalline silicon or another similar material. In addition, the semiconductor layer 610 and the doped semiconductor layer 612 may be sequentially formed by a chemical vapor deposition (CVD) process or another similar deposition process. In other embodiments, the semiconductor layer 610 and the doped semiconductor layer 612 may be integrated into a single semiconductor layer structure.

Figure 6C:
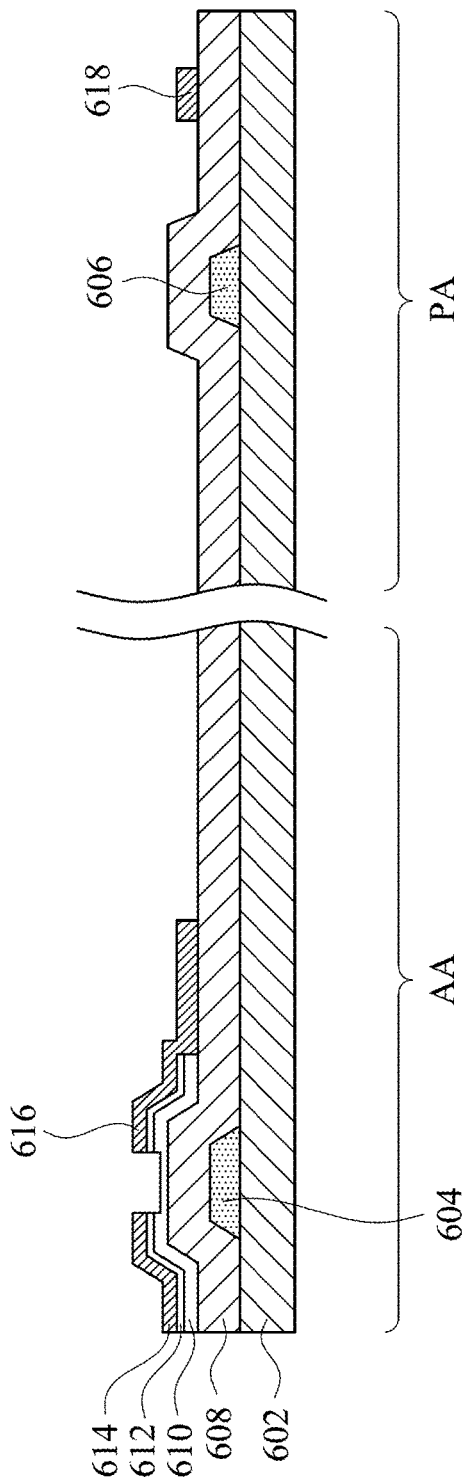

Then, as shown in FIG. 6C, a metal is deposited on the insulating layer 608, the semiconductor layer 610 and the doped semiconductor layer 612, and an etching process is performed to form a source electrode 614 and a drain electrode 616 in the active area AA and a second metal layer 618 in the peripheral area PA. The second metal layer 618 is not overlapped with the first metal layer 606 in a direction perpendicular to the substrate 602, but the invention is not limited thereto. For illustration, the second metal layer 618 includes the connecting lines CL of FIG. 2B and the drains and the sources of the TFTs of the shift register circuit 300 of FIG. 3, but the invention is not limited thereto. In addition, the material that forms the source electrode 614, the drain electrode 616 and the second metal layer 618 may include a metallic element, such as chromium, tungsten, tantalum, titanium, molybdenum, aluminum and copper, or another similar element, or may include a metal alloy or a compound formed from any combination of the above metallic elements, but is not limited thereto.

Figure 6D:
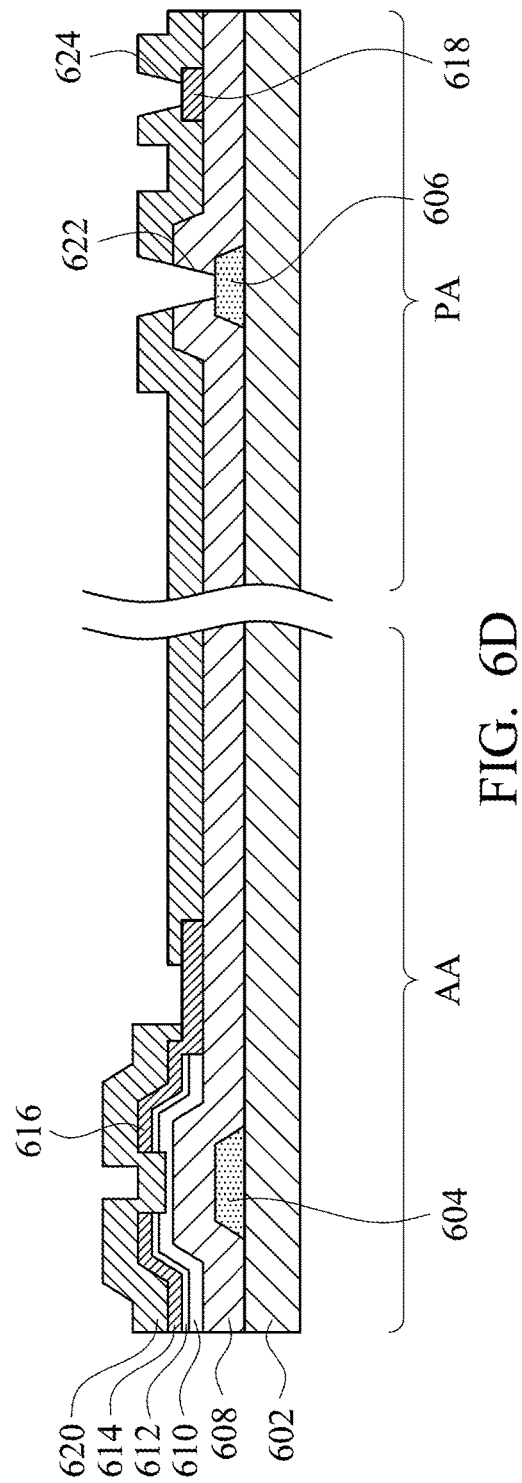

Then, as shown in FIG. 6D, a first passivation layer 620 is formed on the TFT (including the gate electrode 604, the insulating layer 608, the semiconductor layer 610, the doped semiconductor layer 612, the source electrode 614 and the drain electrode 616) of the pixel unit in the active area AA, the insulating layer 608 and the second metal layer 618 in the peripheral area PA. The first passivation layer 620 extends from the active area AA to the peripheral area PA and covers the TFT of the pixel unit, in order to provide protection and insulation for the TFT of the pixel unit. The material of the first passivation layer 620 may be silicon nitride, silicon oxide, silicon oxynitride or another suitable similar material, and may be formed by a CVD process or another similar deposition process. After the first passivation layer 620 is formed, an etching process is then performed on the insulating layer 608 and the first passivation layer 620, so as to form a through hole (which exposes the drain electrode 616) in the active area AA, and to form a first through hole 622 and a second through hole 624 respectively on the first metal layer 606 and the second metal layer 618. The first through hole 622 penetrates the insulating layer 608 and the first passivation layer 620 to expose the first metal layer 606, and the second through hole 624 penetrates the first passivation layer 620 to expose the second metal layer 618.

Then, as shown in FIG. 6E, a first conductive layer 626 is formed on the first metal layer 606, the drain electrode 616, the second metal layer 618 and the first passivation layer 620. In the peripheral area PA, the first conductive layer 626 is electrically connected to the first metal layer 606 through the first through hole 622 and is electrically connected to the second metal layer 618 through the second through hole 624. As such, the first metal layer 606 and the second metal layer 618 are electrically connected to each other through the first conductive layer 626. In the active area AA, the first conductive layer 626 is used as a pixel electrode layer which is electrically connected to the drain electrode 616. The material that forms the first conductive layer 626 may be a transparent conductive material, for example, indium tin oxide (ITO) and indium zinc oxide (IZO), but is not limited thereto, and the first conductive layer 626 may be formed by a physical vapor deposition (PVD) process or another suitable process.

Then, as shown in FIG. 6F, on a second conductive layer 628 is formed on the first passivation layer 620, the first conductive layer 626 and the connecting structure (including the first metal layer 606, the insulating layer 608, the second metal layer 618, the first passivation layer 620 and the first conductive layer 626). The second conductive layer 628 extends from the active area AA to the peripheral area PA and covers the TFT in the active area and the connecting structure in the peripheral area PA, in order to provide protection and insulation for the TFT and the connecting structure. The material of the second conductive layer 628 may be silicon nitride, silicon oxide, silicon oxynitride or another similar material, and the second conductive layer 628 may be formed by a CVD process and another similar deposition process. In some other embodiments, a planarization layer (not shown) may be formed on the TFT and the connecting structure before the second conductive layer 628 is formed, and such planarization layer may include an inorganic material, such as silicon nitride, silicon oxide and silicon oxynitride, and may be formed by a CVD process or another similar deposition process, or may alternatively include an organic material and be formed by a coating process.

Figure 6G:
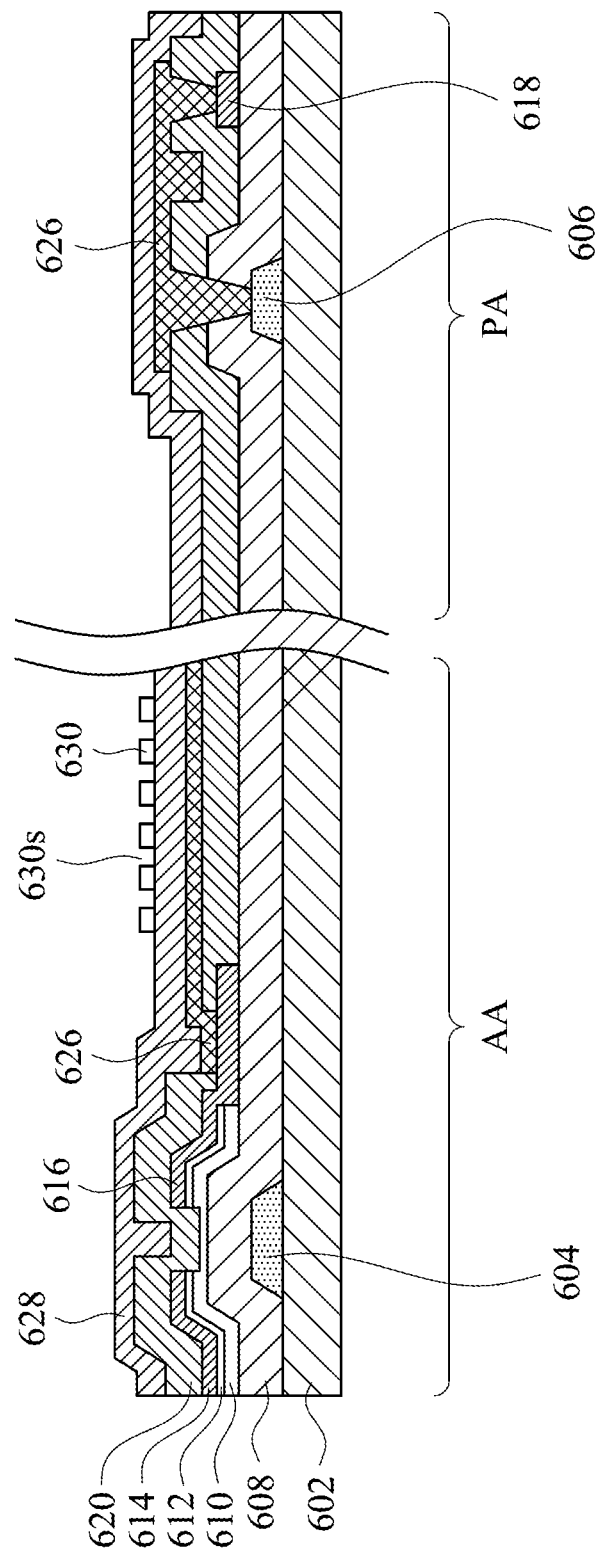

Then, as shown in FIG. 6G, a second conductive layer 630 is deposited on the second conductive layer 628 and in the active area AA. In the pixel unit, the second conductive layer 630 has slits 630s. The second conductive layer 630 is a common electrode layer of the active area AA, and interacts with the first conductive layer 626 to form an electric field, in order to control the liquid crystal molecules to twist or rotate. The material that forms the second conductive layer 630 may be a transparent conductive material, such as ITO and IZO, but is not limited thereto, and the second conductive layer 630 may be formed by a PVD process or another similar deposition process.

It is noted that, in some embodiments, the first metal layer 606 further includes a common electrode line (not shown), and such common electrode line provides a voltage to the common electrode layer 630 in the active area AA. Therefore, a further process is performed before the steps of FIG. 6F and FIG. 6G to form a through hole in the second conductive layer 628, such that the common electrode layer 630 is electrically connected to the common electrode line through the through hole in the second conductive layer 628, the first conductive layer 626 and the through hole penetrating the insulating layer 608 and the first passivation layer 620.

Figure 7A:
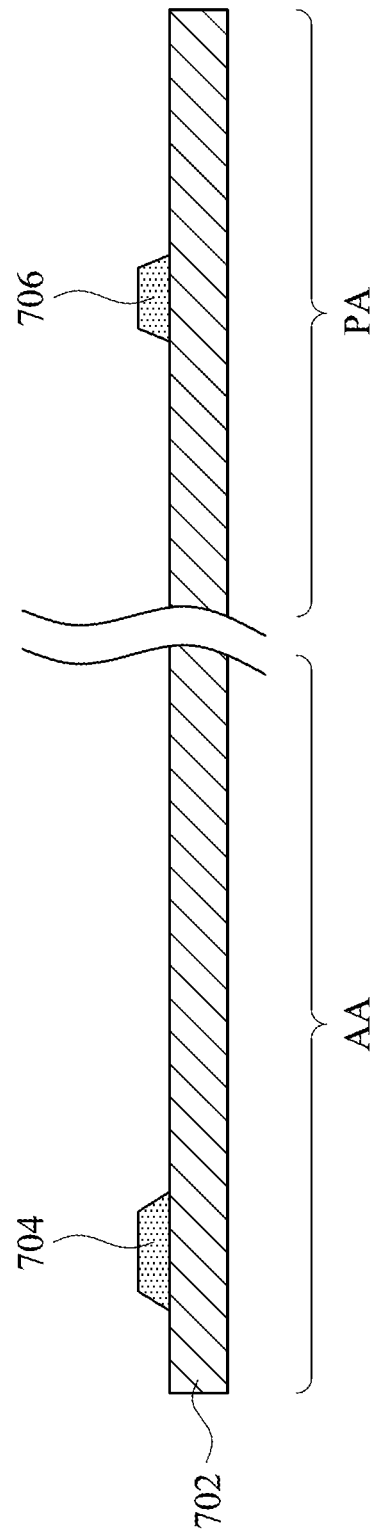
Figure 7B:
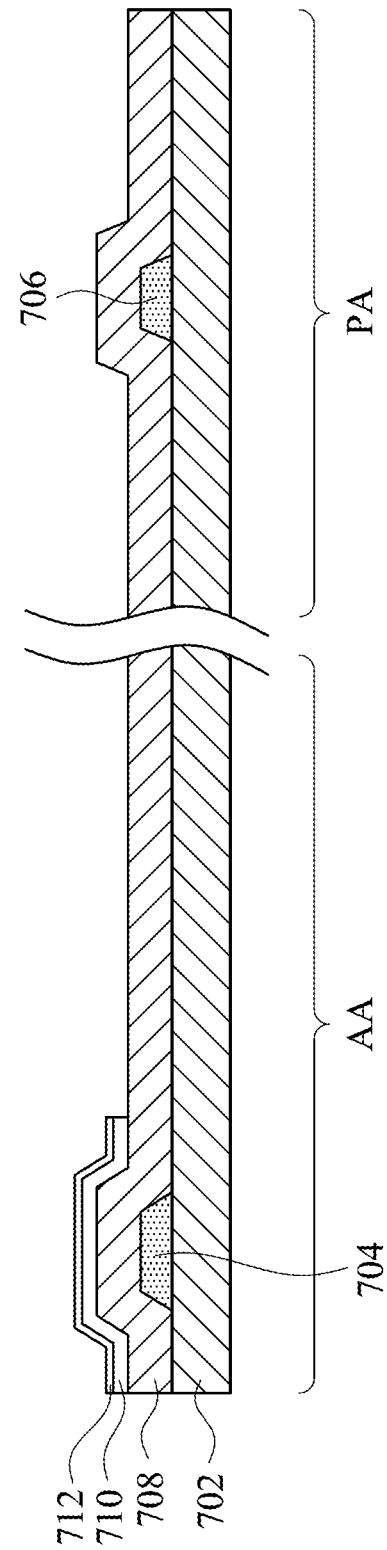

Further, referring to FIG. 7A to FIG. 7H, FIG. 7A to FIG. 7H are schematic cross-sectional views of intermediate stages of fabricating a display panel in accordance with some embodiments of the invention. As shown in FIG. 7A, a substrate 702 is provided, and includes an active area AA and a peripheral area PA, and a gate 704 and a first metal layer 706 are formed on the substrate 702 and respectively in the active area AA and in the peripheral area PA. The first metal layer 706 includes the clock signal lines L1-L4, the starting signal line 3, the ending signal line R of FIG. 2A and FIG. 2B and the gates of the TFTs of the shift register circuit 300 of FIG. 3, but the invention is not limited thereto. Then, as shown in FIG. 7B, an insulating layer 708 is formed on the substrate 702, the gate 704 and the first metal layer 706, and a semiconductor layer 710 and a doped semiconductor layer 712 are sequentially formed on the gate 704 and the insulating layer 708. Afterwards, as shown in FIG. 7C, a metal is deposited on the insulating layer 708, the semiconductor layer 710 and the doped semiconductor layer 712, and an etching process is performed to form a source 714 and a drain 716 in the active area AA and a second metal layer 718 in the peripheral area PA. The second metal layer 718 includes the connecting lines CL of FIG. 2B and the drains and the sources of the TFTs of the shift register circuit 300 of FIG. 3, but the invention is not limited thereto. Then, as shown in FIG. 7D, a first passivation layer 720 is formed on the TFT (including the gate 704, the insulating layer 708, the semiconductor layer 710, the doped semiconductor layer 712, the source 714 and the drain 716) of the pixel unit in the active area AA, the insulating layer 708 and the second metal layer 718 in the peripheral area PA. The forming methods and the materials of the substrate 702, the gate 704, the first metal layer 706, the insulating layer 708, the semiconductor layer 710, the doped semiconductor layer 712, the source 714, the drain 716, the second metal layer 718 and the first passivation layer 720 are the same as or similar to those of the substrate 602, the gate electrode 604, the first metal layer 606, the insulating layer 608, the semiconductor layer 610, the doped semiconductor layer 612, the source electrode 614, the drain electrode 616, the second metal layer 618 and the first passivation layer 620 of FIG. 6A to FIG. 6D, respectively, and thus the related descriptions are not repeated herein. After the first passivation layer 720 is formed, an etching process is performed on the insulating layer 708 and the first passivation layer 720, so as to form a through hole (which exposes the drain 716) in the active area AA, and to form a first through hole 722 and a second through hole 724 respectively on the first metal layer 706 and the second metal layer 718 in the peripheral area PA. The first via hole 722 penetrates the insulating layer 708 and the first passivation layer 720 to expose the first metal layer 706, and the second via hole 724 penetrates the first passivation layer 720 to expose the second metal layer 718.

Then, as shown in FIG. 7E, an organic layer 726 is formed on the first passivation layer 720 and in the active area AA. The organic layer 726 has a through hole (not labeled) which exposes a portion of the drain 716. It is noted that, in some embodiments, the organic layer 726 is not required to be formed for saving a process.

Then, as shown in FIG. 7F, a first conductive layer 728 is formed on the first metal layer 706, the second metal layer 718, the first passivation layer 720 and the organic layer 726. In the peripheral area PA, the first conductive layer 728 is electrically connected to the first metal layer 706 through the first through hole 722 and is electrically connected to the second metal layer 718 through the second through hole 724. As such, the first metal layer 706 and the second metal layer 718 may be electrically connected to each other through the first conductive layer 728. The material that forms the first conductive layer 728 may be a transparent conductive material, such as ITO and IZO, but is not limited thereto, and the first conductive layer 728 may be formed by a PVD process or another similar deposition process, Then, as shown in FIG. 7G, a second passivation layer 730 is formed on the first passivation layer 720, the organic layer 726, the first conductive layer 728 and the connecting structure (including the first metal layer 706, the insulating layer 708, the second metal layer 718, the first passivation layer 720 and the first conductive layer 728). The second passivation layer 730 has a through hole which exposes the drain 716. The second passivation layer 730 extends from the active area AA to the peripheral area PA and covers the TFT in the active area AA and the connecting structure in the peripheral area PA, in order to provide protection and insulation for the TFT and the connecting structure. The material that forms the second passivation layer 730 may be silicon nitride, silicon oxide, silicon oxynitride or another similar material, and the second passivation layer 730 may be formed by a CVD process or another similar deposition process. In some other embodiments, a planarization layer (not shown) may further be formed on the first passivation layer 720, the organic layer 726, the first conductive layer 728 and the connecting structure before the second passivation layer 730 is formed.

Then, as shown in FIG. 7H, a second conductive layer 732 is formed on the drain 716, the organic layer 726 and the second passivation layer 730 and in the active area AA. In the pixel unit, the second conductive layer 732 is electrically connected to the drain 716 and has slits 732s. The first conductive layer 728 and the second conductive layer 732 are respectively a common electrode layer and a pixel electrode layer in the active area AA, and are interacted to form an electric field, in order to control the liquid crystal molecules to twist or rotate. The material that forms the second conductive layer 732 may be a transparent conductive material, such as ITO and IZO, but is not limited thereto, and the second conductive layer 732 may be formed by a PVD process or another similar deposition process.

Figure 8:
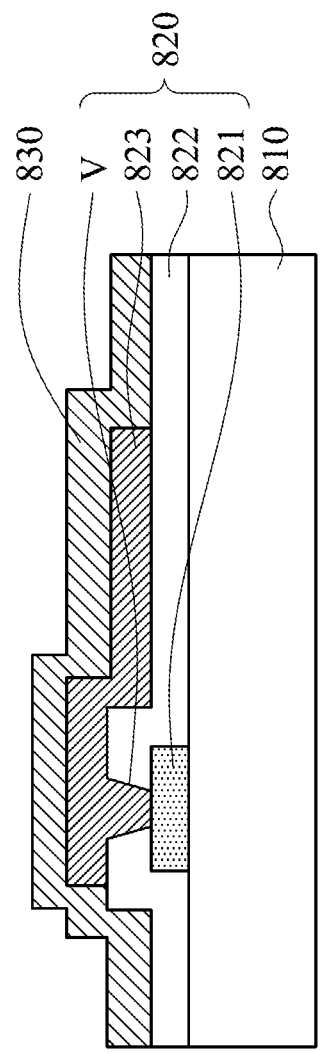
FIG. 8 is a schematic cross-sectional view of a connecting structure in accordance with some embodiments of the invention.

Referring to FIG. 8, FIG. 8 is a schematic cross-sectional view of a connecting structure 820 in accordance with some embodiments of the invention. The connecting structure 820 may be used to couple different metal layers of the gate driving circuit 200, and may be, for example, a connecting point of the clock signal lines L1-L4 and the connecting line CL shown in FIG. 2B or a connecting point of a first terminal of any TFT and a second terminal/third terminal of the same or different TFT shown in FIG. 3, but is not limited thereto.

As shown in FIG. 8, the connecting structure 820 is formed on a substrate 810 and includes a first metal layer 821, an insulating layer 822 and a second metal layer 823. A passivation layer 830 covers the connecting structure 820, in order to prevent the uppermost conductive layer of the connecting structure 820 (the second metal layer 823 in the embodiment) from being eroded by external moisture and then resulting in a deterioration of the reliability of the display panel 110. The first metal layer 821 is disposed on the substrate 810. The insulating layer 822 is disposed on the substrate 810 and the first metal layer 821 and includes a through hole V above the first metal layer 821. The second metal layer 823 is disposed on the first metal layer 821 and the insulating layer 822 and is electrically connected to the first metal layer 821 through the through hole V. The passivation layer 830 is disposed on the insulating layer 822 and the second metal layer 823 and covers the insulating layer 822 and the second metal layer 823.

The substrate 810 corresponds to the first substrate 111 of FIG. 1B, and the first metal layer 821 and the second metal layer 823 may be formed by the same process(es) as the first terminal and the second terminal/third terminal of the TFTs T1-T6 of the shift register circuit 300 of FIG. 3, respectively. In addition, the clock signal lines L1-L4, the starting signal line S and/or the ending signal line R of the gate driving circuit 200 and one of the first metal layer 821 and the second metal layer 823 may belong to the same layer, and the connecting lines CL and the other of the first metal layer 821 and the second metal layer 823 may belong to the same layer. Further, because the second metal layer 823 is covered by the passivation layer 830 and does not expose, and therefore external moisture can be blocked from eroding the first metal layer 821 and the second metal layer 823. Furthermore, the sealant for bonding opposite two substrates of the display panel (e.g., the sealant 132 of FIG. 1B) may partially or completely cover the connecting structure 820, i.e., the vertical projections of the sealant and the connecting structure 820 may be overlapped. As such, the first metal layer 821 and the second metal layer 823 can be further prevented from being eroded by external moisture.

Figure 9A:
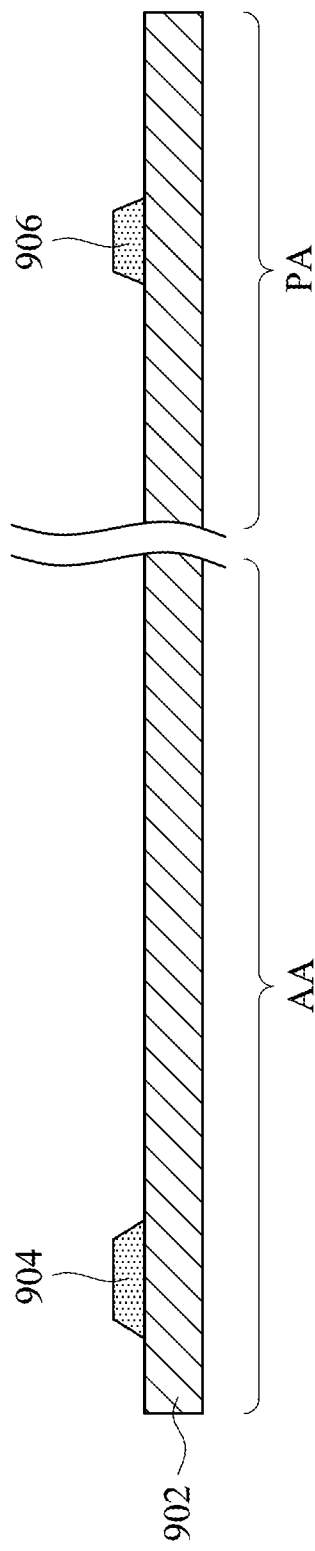

In the following, a transverse electrical field (or called horizontal electrical field) type display panel is exemplified for illustrating how to fabricate the connecting structure 820 of the peripheral area PA simultaneously during the processes of forming the pixel unit of the active area AA. Referring to FIG. 9A to FIG. 9F, FIG. 9A to FIG. 9F are schematic cross-sectional views of intermediate stages of fabricating a display panel in accordance with some embodiments of the invention. As shown in FIG. 9A, a substrate 902 is provided, and includes an active area AA and a peripheral area PA and may be formed from glass, quartz, ceramic, combinations thereof or another similar insulating material. Afterwards, a metal is deposited on the substrate 902, and a lithographic process and an etching process are performed on the metal deposited on the substrate 902, so as to form a gate 904 and a first metal layer 906 respectively in the active area AA and in the peripheral area PA. In addition, the material that forms the gate 904 and the first metal layer 906 may include a metallic element, such as chromium, tungsten, tantalum, titanium, molybdenum, aluminum and copper, or another similar element, or may include a metal alloy or a compound formed from any combination of the above metallic elements, but is not limited thereto.

Figure 9B:
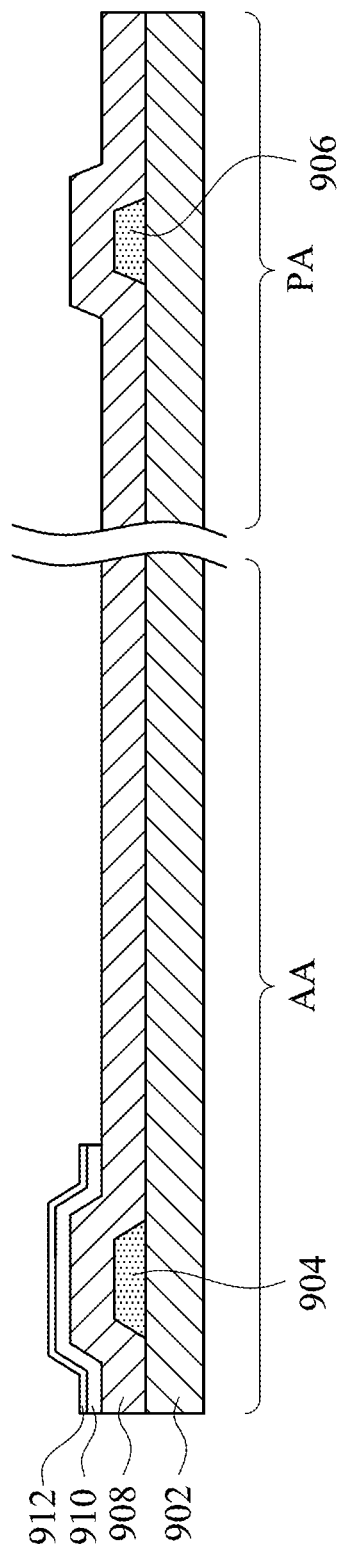

Then, as shown in FIG. 9B, an insulating layer 908 is formed on the substrate 902, the gate 904 and the first metal layer 906, and a semiconductor layer 910 and a doped semiconductor layer 912 are sequentially formed on the gate 904 and the insulating layer 908. The insulating layer 908 extends from the active area AA to the peripheral area PA and covers the gate 904 and the first metal layer 906. The material of the semiconductor layer 910 may be amorphous silicon, monocrystalline silicon, polycrystalline silicon or another similar material, and the material of the doped semiconductor layer 912 may be correspondingly doped amorphous silicon, doped monocrystalline silicon, doped polycrystalline silicon or another similar material. In addition, the semiconductor layer 910 and the doped semiconductor layer 912 may be sequentially formed by a CVD process or another similar deposition process. In other embodiments, the semiconductor layer 910 and the doped semiconductor layer 912 may be integrated into a single semiconductor layer structure.

Figure 9C:
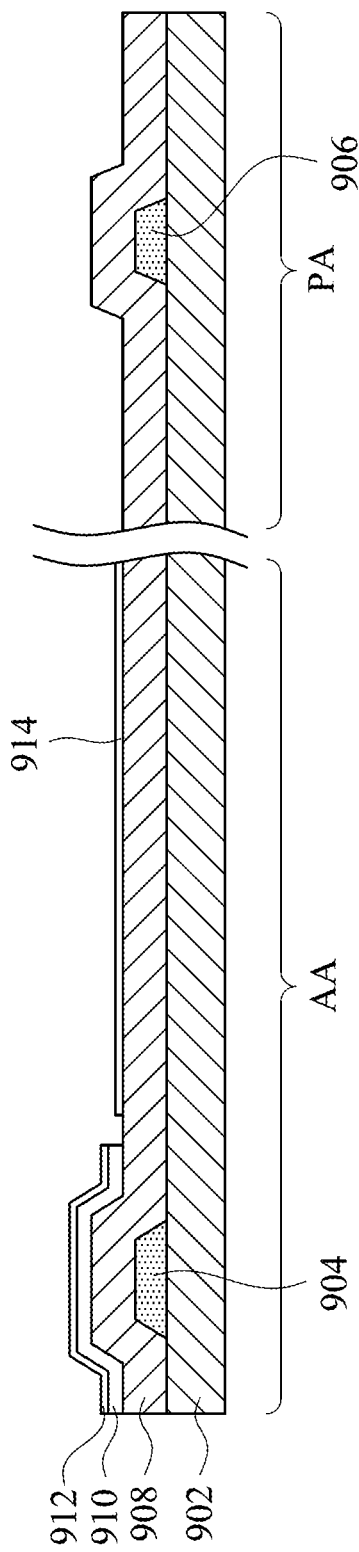

Then, as shown in FIG. 9C, a first conductive layer 914 is formed on the insulating layer 908 and in the active area AA. The first conductive layer 914 is a pixel electrode layer in the active area AA, and the material of the first conductive layer 914 may be a transparent conductive material, such as ITO and IZO, but is not limited thereto.

Figure 9D:
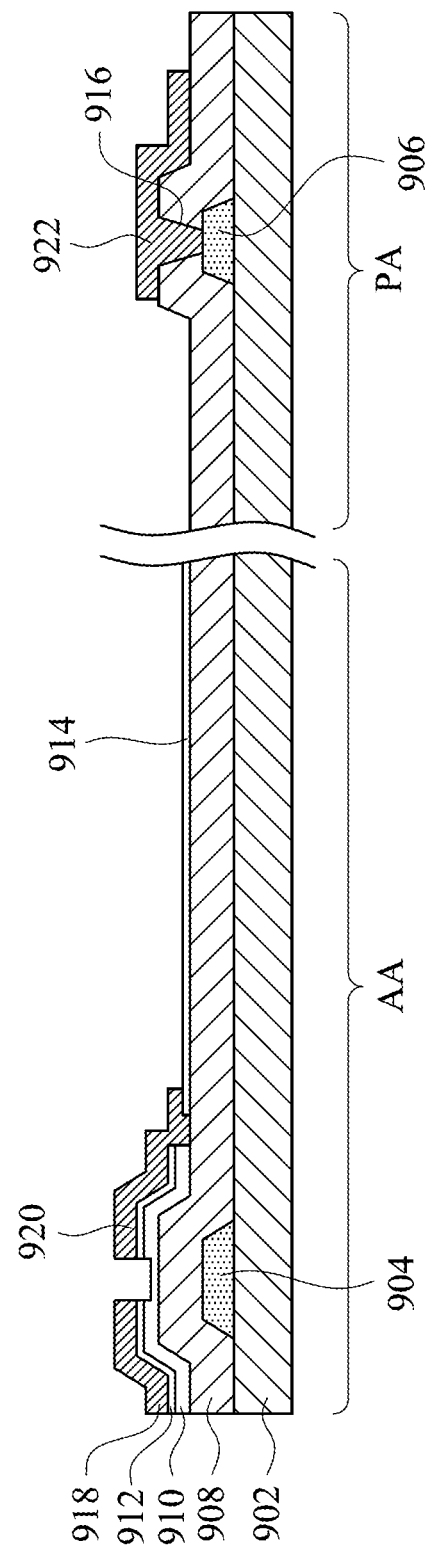

Then, as shown in FIG. 9D, a through hole 916 is formed on the first metal layer 906. The through hole 916 penetrates the insulating layer 908 to expose the first metal layer 906. Afterwards, a metal is deposited on the first metal layer 906, the insulating layer 908, the semiconductor layer 910 and the doped semiconductor layer 912, and an etching process is performed to form a source 918 and a drain 920 in the active area AA and a second metal layer 922 in the peripheral area PA. The drain 920 is electrically connected to the first conductive layer 914, and the second metal layer 922 is electrically connected to the first metal layer 906 through the through hole 916. In addition, the material that forms the source 918, the drain 920 and the second metal layer 922 may include a metallic element, such as chromium, tungsten, tantalum, titanium, molybdenum, aluminum and copper, or another similar element, or may include a metal alloy or a compound formed from any combination of the above metallic elements, but is not limited thereto.

Then, as shown in FIG. 9E, a passivation layer 924 is formed on the TFT (including the gate 904, the insulating layer 908, the semiconductor layer 910, the doped semiconductor layer 912, the source 918 and the drain 920) and the connecting structure (including the first metal layer 906, the insulating layer 908 and the second metal layer 922). The passivation layer 924 extends from the active area AA to the peripheral area PA and covers the TFT in the active area AA and the connecting structure in the peripheral area PA, in order to provide protection and insulation for the TFT and the connecting structure. The material that forms the passivation layer 924 may be silicon nitride, silicon oxide, silicon oxynitride or another similar material, and the passivation layer 924 may be formed by a CVD process or another similar deposition process. In some other embodiments, a planarization layer (not shown) may be formed on the TFT and the connecting structure before the passivation layer 924 is formed, and such planarization layer may include an inorganic material, such as silicon nitride, silicon oxide and silicon oxynitride, and may be formed by a CVD process or another similar deposition process, or may alternatively include an organic material and be formed by a coating process.

Then, as shown in FIG. 9F, a second conductive layer 926 is disposed on the passivation layer 924 and in the active area AA. The second conductive layer 926 has slits 926s in each pixel unit. The second conductive layer 926 is a common electrode layer in the active area AA, and interacts with the first conductive layer 914 to form an electric field, in order to control the liquid crystal molecules to twist or rotate. The material that forms the second conductive layer 926 may be a transparent conductive material, such as ITO and IZO, but is not limited thereto.

It is noted that, in the embodiments of FIG. 6A FIG. 6G, FIG. 7A to FIG. 7H and FIG. 9A to FIG. 9F, the TFT is bottom-gate type, i.e., the gate of the TFT and the first metal layer (606, 706 or 906) of the connecting structure belong to the same layer, and the drain and the source of the TFT and the second metal layer (618, 718 or 922) belong to the same layer. However, the invention is not limited to the above-mentioned descriptions. For illustration, in the embodiments of top-gate type TFT, the drain and the source of the TFT and the first metal layer of the connecting structure belong to the same layer, and the gate of the TFT and the second metal layer of the connecting structure belong to the same layer.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A display panel, comprising:
  a first substrate having an active area and a peripheral area;
  a pixel unit located on the active area of the first substrate, wherein the pixel unit comprises a pixel thin film transistor (TFT), a pixel electrode and a common electrode;
  a connecting structure disposed on the first substrate and located in the peripheral area, wherein the connecting structure is configured to electrically connect different metal layers, and the connecting structure comprises:
    a first metal layer disposed on the first substrate;
    a first insulating layer disposed on the first substrate and the first metal layer;
    a second metal layer disposed on the first insulating layer;
    a second insulating layer disposed on the first insulating layer and the second metal layer, wherein a combination of the first insulating layer and the second insulating layer comprises a first through hole, wherein the second insulating layer further comprises a second through hole, and wherein the first through hole and the second through hole expose the first metal layer and the second metal layer, respectively; and
    a conductive layer disposed on the second insulating layer, wherein the conductive layer is electrically connected to the first metal layer and the second metal layer respectively through the first through hole and second through hole, and the conductive layer and one of the pixel electrode and the common electrode belong to a transparent conductive layer;
  a passivation layer disposed on the connecting structure, wherein the passivation layer covers the conductive layer;
  a second substrate disposed opposite to the first substrate; and
  a sealant sandwiched between the first substrate and the second substrate;
  wherein a vertical projection of the sealant on the first substrate and a vertical projection of the connecting structure on the first substrate are overlapped.

2. The display panel of claim 1, wherein the pixel TFT is covered by the passivation layer.

3. The display panel of claim 2, wherein the passivation layer is disposed extending from the active area to the peripheral area.

4. The display panel of claim 1, further comprising:
  a driving circuit disposed on the first substrate and located in the peripheral area, wherein the driving circuit comprises the connecting structure.

5. The display panel of claim 4, wherein the driving circuit comprises a first TFT, and the first TFT comprises a gate, a source and a drain;
  wherein the gate and one of the first metal layer and the second metal layer belong to the same layer, the source, the drain and the other of the first metal layer and the second metal layer belong to the same layer, and one of the source and the drain is electrically connected to the gate through the connecting structure.

6. The display panel of claim 4, wherein the driving circuit comprises a first TFT and a second TFT, the first TFT comprises a first gate, a first source and a first drain, and the second TFT comprises a second gate, a second source and a second drain;
  wherein the first gate, the second gate and one of the first metal layer and the second metal layer belong to the same layer, the first source, the first drain, the second source, the second drain and the other of the first metal layer and the second metal layer belong to the same layer, and one of the first source and the first drain is electrically connected to the second gate through the connecting structure.

7. The display panel of claim 4, wherein the driving circuit comprises a first TFT and a signal line, and the signal line is electrically connected to the first TFT through a connecting line;
wherein the signal line and one of the first metal layer and the second metal layer belong to the same layer, the connecting line and the other of the first metal layer and the second metal layer belong to the same layer, and the signal line is electrically connected to the connecting line through the connecting structure.

8. A method of manufacturing a display panel, comprising:
providing a first substrate, wherein the first substrate has an active area and a peripheral area;
forming a pixel unit and a connecting structure on the first substrate, wherein the pixel unit and the connecting structure are located in the active area and the peripheral area, respectively, the pixel unit comprises a thin film transistor (TFT), a pixel electrode and a common electrode, and the connecting structure is configured to electrically connect different metal layers, wherein forming the connecting structure comprises:
forming a first metal layer on the first substrate;
forming a first insulating layer on the first substrate and the first metal layer;
forming a second metal layer on the first insulating layer;
forming a second insulating layer on the first insulating layer and the second metal layer;
forming a first through hole penetrating the first insulating layer and the second insulating layer, wherein the first through hole exposes the first metal layer;
forming a second through hole penetrating the second insulating layer, wherein the second through hole exposes the second metal layer; and
forming a conductive layer on the second insulating layer, wherein the conductive layer is electrically connected to the first metal layer and the second metal layer respectively through the first through hole and second through hole, wherein the conductive layer and one of the pixel electrode and the common electrode belong to a transparent conductive layer;
forming a passivation layer on the connecting structure and the TFT, wherein the passivation layer covers the TFT and the conductive layer;
providing a second substrate; and
forming a sealant sandwiched between the first substrate and the second substrate, wherein the second substrate is disposed opposite to the first substrate;
wherein a vertical projection of the sealant on the first substrate and a vertical projection of the connecting structure on the first substrate are overlapped.

9. A display panel, comprising:
a first substrate having an active area and a peripheral area;
a pixel unit located on the active area of the first substrate, wherein the pixel unit comprises a thin film transistor (TFT), a pixel electrode and a common electrode;
a driving circuit disposed on the first substrate and located in the peripheral area, wherein the driving circuit comprises another TFT and a connecting structure, wherein the connecting structure is configured to electrically connect different metal layers, and the connecting structure comprises:
a first metal layer disposed on the first substrate;
a first insulating layer disposed on the first substrate and the first metal layer;
a second metal layer disposed on the first insulating layer;
a second insulating layer disposed on the first insulating layer and the second metal layer, wherein a combination of the first insulating layer and the second insulating layer comprises a first through hole, wherein the second insulating layer further comprises a second through hole, and wherein the first through hole and the second through hole expose the first metal layer and the second metal layer, respectively; and
a conductive layer disposed on the second insulating layer, wherein the conductive layer is electrically connected to the first metal layer and the second metal layer respectively through the first through hole and second through hole;
a passivation layer disposed on the connecting structure, wherein the passivation layer covers the conductive layer;
a second substrate disposed opposite to the first substrate; and
a sealant sandwiched between the first substrate and the second substrate, wherein the sealant at least partially covers the driving circuit in a direction perpendicular to the first substrate;
wherein the TFT of the pixel unit and the another TFT of the driving circuit are made simultaneously by the same processes, a vertical projection of the sealant on the first substrate and a vertical projection of the connecting structure on the first substrate are overlapped, and the conductive layer and one of the pixel electrode and the common electrode belong to a transparent conductive layer.

* * * * *